(12) United States Patent
Sato et al.

(10) Patent No.: US 7,755,145 B2
(45) Date of Patent: Jul. 13, 2010

(54) SEMICONDUCTOR DEVICE AND MANUFACTURING METHOD THEREOF

(75) Inventors: Yoshihiro Sato, Hyogo (JP); Kazuhiko Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 141 days.

(21) Appl. No.: 12/028,258

(22) Filed: Feb. 8, 2008

(65) Prior Publication Data

US 2008/0315318 A1  Dec. 25, 2008

(30) Foreign Application Priority Data

Jun. 19, 2007  (JP) .............................. 2007-161650

(51) Int. Cl.
*H01L 27/092* (2006.01)
*H01L 21/8238* (2006.01)

(52) U.S. Cl. ............... 257/369; 257/316; 257/E27.062; 257/E27.108

(58) Field of Classification Search .................. 257/316, 257/327, 369, 412, E29.3, E21.476; 438/585, 438/664

See application file for complete search history.

(56) References Cited

U.S. PATENT DOCUMENTS

2007/0210351 A1* 9/2007 Tsuchiya et al. ............ 257/288

OTHER PUBLICATIONS

Kittl et al. "Scalability of Ni FUSI gate processes: phase and Vt control to 30nm gate lengths" Symposium on VLSI Technology Digest of Technical Papers, 2005, pp. 72-73.

T. Huffmann et al. "CMOS Integration of Dual Work Function Phase Controlled Ni FUSI with Simultaneous Silicidation of NMOS (NiSi) and PMOS ( Ni-rich silicide) Gates on HfSiON" IEDM 2005, 4 pages.

Lauwers et al. "Ni-based FUSI gates: CMOS Integration for 45 nm node and beyond" IEDM 2006, 4 pages.

Tsuchiya et al. "Practical Work Tuning Based on Physical and Chemical nature of Interfacial Impurity in Ni-FUSI/SiON and HfSiON Systems" IEDM 2005, 4 pages.

Lauwers et al. "CMOS Integration of Dual Work Function Phase Controlled Ni FUSI with Simultaneous Silicidation of NMOS (NiSi) and PMOS ( Ni-rich silicide) Gates on HfSiON" IEDM 2005, 4 pages.

T. Hoffmann et al. "Ni-based FUSI gates: CMOS Integration for 45 nm node and beyond" IEDM 2006, 4 pages.

(Continued)

*Primary Examiner*—Fernando L Toledo
*Assistant Examiner*—Mamadou Diallo
(74) *Attorney, Agent, or Firm*—McDermott Will & Emery LLP

(57) ABSTRACT

A semiconductor device includes an n-type MIS (Metal Insulator Semiconductor) transistor and a p-type MIS transistor. The n-type MIS transistor includes a first gate insulating film, a first fully silicided (FUSI) gate electrode formed on the first gate insulating film and made of a first metal silicide film, and a first sidewall insulating film. The p-type MIS transistor includes a second gate insulating film, a second fully silicided (FUSI) gate electrode formed on the second gate insulating film and made of a second metal silicide film, and a second sidewall insulating film. A top surface of the first FUSI gate electrode is located lower than a top surface of the second FUSI gate electrode.

11 Claims, 9 Drawing Sheets

OTHER PUBLICATIONS

Kittl et al. "Scalability of Ni FUSI gate processes: phase and Vt control to 30nm gate lengths" Symposium on VLSI Technology Digest of Technical Papers, 2005, pp. 72-73.

T. Hoffmann et al. "Ni-based FUSI gates: CMOS Integration for 45 nm node and beyond" IEDM 2006, 4 pages.

Lauwers et al. "CMOS Integration of Dual Work Function Phase Controlled Ni FUSI with Simultaneous Silicidation of NMOS (NiSi) and PMOS ( Ni-rich silicide) Gates on HfSiON" IEDM 2005, 4 pages.

Tsuchiya et al. "Practical Work Tuning Based on Physical and Chemical nature of Interfacial Impurity in Ni-Fusi/SiON and HfSION Systems" IEDM 2006, 4 pages.

* cited by examiner

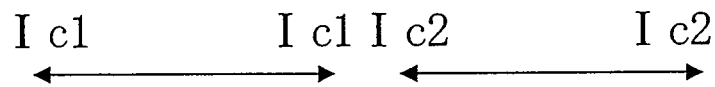

SEMICONDUCTOR DEVICE AND MANUFACTURING METHOD THEREOF

FIELD OF THE INVENTION

The invention generally relates to a semiconductor device and a manufacturing method thereof. More particularly, the invention relates to a semiconductor device having a fully-silicided gate electrode and a manufacturing method thereof.

BACKGROUND ART

With improvement in the integration level and operation speed of semiconductor integrated circuit devices, dimensions of MISFETs (Metal Insulator Semiconductor Field Effect Transistors) have been increasingly reduced. Recently, metal gate electrode technology has been actively studied as a solution to presence of a depletion capacitor of a polysilicon gate electrode and boron punch-through to the channel region due to an ultrathin gate electrode film. In particular, FUSI (fully silicided) technology, a technology of forming the entire gate electrode from a metal silicide film, has attracted attention as a promising technology since this technology can be implemented based on the currently used silicon process technology.

In MISFETs using a FUSI gate electrode, an n-MISFET and a p-MISFET are each properly formed and a transistor threshold voltage is controlled by silicide phase control of a FUSI gate electrode. The work function of a metal silicide film changes according to the silicide composition ratio of the metal silicide film. Therefore, by setting the silicide composition ratio of the FUSI gate electrode to a desired value, the work function of the FUSI gate electrode can be adjusted to a desired value and the MIS transistor threshold voltage can be controlled (for example, see Non-patent documents 1 through 4).

Non-patent document 1: J. A. Kittl et. al., "Scalability of Ni FUSI gate processes: phase and Vt control to 30 nm gate lengths," VLSI 2005;

Non-patent document 2: A. Lauwers et al., "CMOS Integration of Dual Work Function Phase Controlled Ni FUSI with Simultaneous Silicidation of NMOS (NiSi) and PMOS (Ni-rich silicide) Gates on HfSiON," IEDM 2005;

Non-patent document 3: T. Hoffmann et al., "Ni-based FUSI gates: CMOS Integration for 45 nm node and beyond," IEDM 2006; and Non-patent document 4: Y. Tsuchiya et al., "Practical Work Tuning Based on Physical and Chemical Nature of Interfacial Impurity in Ni-FUSI/SiON and HfSiON Systems," IEDM 2006.

A FUSI gate electrode for an n-MISFET and a FUSI gate electrode for a p-MISFET are each properly formed based on the film thickness ratio of a silicon film for a gate electrode to a nickel film deposited on the silicon film. More specifically, provided that the silicon film thickness is tSi and the nickel film thickness is tNi, the film thickness ratio tNi/tSi needs to be 0.55<tNi/tSi<0.8 in order to form a NiSi-FUSI gate electrode for an n-MISFET. For example, the film thickness ratio needs to be 1.1<tNi/tSi in order to form a $Ni_2Si$-FUSI gate electrode for a p-MISFET. By controlling heat treatment conditions (temperature and time) for causing a reaction between the silicon film and the nickel film so as to satisfy this film thickness ratio, phase control of a FUSI gate electrode for an n-MISFET and a FUSI gate electrode for a p-MISFET is conducted, whereby a FUSI gate electrode for an n-MISFET and a FUSI gate electrode for a p-MISFET are formed.

A MISFET threshold voltage changes according to the work function of the FUSI gate electrode. In the case of a Ni-based FUSI gate electrode, the work function increases as the Ni composition ratio increases. Accordingly, NiSi or $NiSi_2$ is preferable as a FUSI gate electrode for an n-MISFET and $Ni_2Si$, $Si_{31}Si_{12}$, $Ni_3Si$, or the like is preferable as a FUSI gate electrode for a p-MISFET. These compositions of the FUSI gate electrode are properly used according to a desired threshold voltage. For example, in order to implement a low threshold voltage MISFET, it is preferable to use $NiSi_2$ as a FUSI gate electrode for an n-MISFET and it is preferable to use $Ni_{31}Si_{12}$ or $Ni_3Si$ as a FUSI gate electrode for a p-MISFET.

A conventional manufacturing method of a semiconductor device will now be briefly described with reference to FIGS. 10A through 10D. FIG. 10A is a plan view of the structure of a conventional semiconductor device. FIGS. 10B through 10D are cross-sectional views of a main part of the semiconductor device in the gate width direction taken along line Xd-Xd in FIG. 10A, and sequentially illustrate the steps of a conventional manufacturing method of a semiconductor device. In the figures, the letter "N" on the left-hand side refers to an n-type MIS transistor formation region and the letter "P" on the right-hand side refers to a p-type MIS transistor formation region.

By conducting the same steps as those of a common manufacturing method of a semiconductor device having a polysilicon gate electrode, gate electrode formation films 104a and 104b made of a polysilicon film are formed as shown in FIG. 10B. More specifically, the gate electrode formation film 104a is formed on an active region 100a of an n-type MIS transistor formation region with a gate insulating film 103 interposed therebetween, and the gate electrode formation film 104b is formed on an active region 100b of a p-type MIS transistor formation region with the gate insulating film 103 interposed therebetween. In a p-type well region 102a of a semiconductor substrate 100, the active region 100a is surrounded by an element isolation region 101. In an n-type well region 102b of the semiconductor substrate 100, the active region 100b is surrounded by the element isolation region 101. Thereafter, a sidewall 105 is formed on the side surfaces of the gate electrode formation films 104a and 104b (see FIG. 10A). A resist mask pattern 106 is then formed so as to cover the gate electrode formation film 104a in the n-type MIS transistor formation region. By using the resist mask pattern 106 as a mask, the gate electrode formation film 104b in the p-type MIS transistor formation region is etched so that the gate electrode formation film 104b in the p-type MIS transistor formation region becomes thinner than the gate electrode formation region 104a in the n-type MIS transistor formation region.

As shown in FIG. 10C, the resist mask pattern 106 covering the gate electrode formation film 104a in the n-type MIS transistor formation region is then removed, and a metal film 107 is formed over the whole surface of the semiconductor substrate 100 so as to cover the gate electrode formation films 104a and 104b. For example, the metal film 107 is made of nickel.

In this way, the film thickness ratio of the metal film 107 to the gate electrode formation film 104a in the n-type MIS transistor formation region, that is, the film thickness ratio of nickel to silicon in the n-type MIS transistor formation region, Ni/Si, is made smaller than the film thickness ratio of nickel to silicon in the p-type MIS transistor formation region, Ni/Si.

As shown in FIG. 10D, heat treatment is conducted to cause a reaction between silicon of the gate electrode formation film 104a in the n-type MIS transistor formation region and nickel of the metal film 107 and between silicon of the gate electrode formation film 104b in the p-type MIS transistor formation region and nickel of the metal film 107, whereby metal silicidation of each gate electrode formation region is conducted. The unreacted metal film 107 remaining over the semiconductor substrate 100 is then removed by an etching method.

By thus causing a reaction between the whole gate electrode formation film 104a and the metal film 107 and between the whole gate electrode formation film 104b and the metal film 107, FUSI gate electrodes 108a and 108b are formed in the n-type MIS transistor formation region and the p-type MIS transistor formation region, respectively. The FUSI gate electrode 108a thus obtained is made of a metal silicide film having a silicide composition ratio according to the film thickness ratio of the metal film thickness $N_{Ni}$ to the polysilicon film thickness $N_{Si}$ in the FUSI process. Similarly, the FUSI gate electrode 108b is made of a metal silicide film having a silicide composition ratio according to the film thickness ratio of the metal film thickness $P_{Ni}$ to the polysilicon film thickness $P_{Si}$ in the FUSI process. FIG. 10D is a cross-sectional view taken along line Xd-Xd in FIG. 10A.

In the conventional manufacturing method of a semiconductor device, the polysilicon film thickness of the gate electrode formation film in the p-type MIS transistor formation region is adjusted by an etching method. In order to accurately implement this adjustment, etching conditions, especially an etching rate and etching time, need to be controlled accurately.

As shown below, however, it is very difficult to accurately control the etching rate, and therefore, the conventional manufacturing method of a semiconductor device has the following problems.

For example, it is very difficult to uniformly adjust the temperature in the chamber (i.e., the etching temperature) between different lots, and therefore the etching rate varies between different lots. Even within the same lot, it is very difficult to uniformly adjust the temperature in the chamber while wafers are sequentially subjected to an etching process. Therefore, the etching rate also varies within the same lot. Accordingly, in the conventional manufacturing method of a semiconductor device, the polysilicon film thickness of the gate electrode formation film in the p-type MIS transistor formation region significantly varies between wafers due to the non-uniform etching rate between different lots and the non-uniform etching rate within the same lot.

Even in the same wafer, a polysilicon film having a large etching area and a polysilicon film having a small etching area are both subjected to the same amount of etching gas regardless of the difference in the etching area. Since the amount of etching gas to the etching area is different, the etching rate is different between these polysilicon films. Therefore, in the conventional manufacturing method of a semiconductor device, the polysilicon film thickness of the gate electrode formation film in the p-type MIS transistor formation region varies even in the same wafer due to the difference in the etching rate.

As described above, the polysilicon film thickness varies between the wafers and even within the same wafer in the conventional manufacturing method of a semiconductor device. Therefore, the polysilicon film thickness varies between the gate electrode formation films in the different p-type MIS transistor formation regions. In other words, the thickness ratio of the metal film to the polysilicon film varies between the gate electrode formation films in the different p-type MIS transistor formation regions.

Even in the gate electrode formation film of the same p-type MIS transistor formation region, the etching rate is different between the end portion and the central portion of the surface of the polysilicon film. Therefore, in the conventional manufacturing method of a semiconductor device, the polysilicon film thickness varies within the gate electrode formation film in the same p-type MIS transistor formation region due to the difference in the etching rate between the end portion and the central portion of the polysilicon film. In other words, such a difference in etching rate between the end portion and the central portion of the polysilicon film causes roughness on the polysilicon film surface. As a result, the film thickness ratio of the metal film to the polysilicon film varies within the gate electrode formation film of the same p-type MIS transistor formation region (in other words, the film thickness ratio is different between the end portion and the central portion of the polysilicon film).

As described above, in the conventional manufacturing method of a semiconductor device, the film thickness ratio varies between the gate electrode formation films in the different p-type MIS transistor formation regions and also varies within the gate electrode formation film in the same p-type MIS transistor formation region. As a result, the silicide composition ratio of the metal silicide film varies between the different p-type MIS transistors and also varies within the same p-type MIS transistor (in other words, the silicide ratio is different between the end portion and the central portion of the metal silicide film).

Accordingly, in the conventional manufacturing method of a semiconductor device, a FUSI gate electrode made of a metal silicide film having a desired silicide composition ratio can be obtained in an n-type MIS transistor. However, a FUSI gate electrode made of a metal silicide film having a desired silicide composition ratio cannot be obtained in a p-type MIS transistor, that is, in a MIS transistor having its polysilicon film thickness adjusted by etching. In other words, it is impossible to obtain a FUSI gate electrode made of a metal silicide film having a desired silicide composition ratio in both an n-type MIS transistor and a p-type MIS transistor.

Therefore, in the conventional manufacturing method of a semiconductor device, the threshold voltage of an n-type MIS transistor can be controlled to a desired value, while the threshold voltage of a p-type MIS transistor cannot be controlled to a desired value. It is therefore impossible to obtain a desired threshold voltage in both an n-type MIS transistor and a p-type MIS transistor.

As shown in FIG. 10B, the polysilicon film has a stepped portion at the boundary between the gate electrode formation film 104a in the n-type MIS transistor formation region and the gate electrode formation region 104b in the p-type MIS transistor formation region. In the step of FIG. 10C, heat treatment is conducted to cause a reaction between silicon of the gate electrode formation film 104a in the n-type MIS transistor formation region and the gate electrode formation film 104b in the p-type MIS transistor formation region and nickel of the metal film 107. Since the polysilicon film has a stepped portion at the boundary, nickel is supplied not only from the top surface but the exposed part of the side surface of the gate electrode formation film 104a in the n-type MIS transistor formation region during the metal silicidation process. Therefore, nickel is oversupplied in a region adjacent to the p-type MIS transistor formation region in the gate electrode formation film 104a in the n-type MIS transistor formation region. As a result, the silicide composition is likely to vary in this region and a silicide composition mixed region 108c is likely to expand as shown in FIG. 10D. When the silicide composition mixed region 108c expands over the active region 100a in the n-type MIS transistor formation region or the active region 100b in the p-type MIS transistor formation region, the transistor threshold voltage varies, and a desired threshold voltage cannot be obtained. In order to avoid the above problems, a larger element isolation region 101 may be formed to separate the active region 100a in the n-type MIS transistor formation region and the active region 100b in the p-type MIS transistor formation region. However, this hinders dimensional reduction of a semiconductor integrated circuit device.

SUMMARY OF THE INVENTION

The invention is made in view of the above problems, and it is an object of the invention to accurately implement a fully silicided gate electrode of a metal silicide film having a desired silicide composition ratio in both an n-type MIS transistor and a p-type MIS transistor by accurately adjusting the thickness of a gate electrode formation film in an n-type MIS transistor formation region and the thickness of a gate electrode formation film in a p-type MIS transistor formation region to a desired value. It is another object of the invention to suppress expansion of a silicide composition mixed region at the boundary between the gate electrode formation film in the n-type MIS transistor formation region and the gate electrode formation film in the p-type MIS transistor formation region.

In order to achieve the above objects, a semiconductor device according to an aspect of the invention includes: an n-type MIS (Metal Insulator Semiconductor) transistor formed over a first active region of a semiconductor substrate; a p-type MIS transistor formed over a second active region of the semiconductor substrate; and an interlayer insulating film formed over the semiconductor substrate so as to cover the n-type MIS transistor and the p-type MIS transistor. The n-type MIS transistor includes a first gate insulating film formed on the first active region, a first fully silicided (FUSI) gate electrode formed on the first gate insulating film and made of a first metal silicide film, and a first sidewall insulating film formed on a side surface of the first FUSI gate electrode. The p-type MIS transistor includes a second gate insulating film formed on the second active region, a second fully silicided (FUSI) gate electrode formed on the second gate insulating film and made of a second metal silicide film, and a second sidewall insulating film formed on a side surface of the second FUSI gate electrode. A top surface of the first FUSI gate electrode is located lower than a top surface of the second FUSI gate electrode.

In the above semiconductor device, the first FUSI gate electrode and the second FUSI gate electrode may be formed integrally.

In the above semiconductor device, the n-type MIS transistor may further include a mask insulating film formed between the first FUSI gate electrode and the interlayer insulating film so as to cover the first FUSI gate electrode.

The mask insulating film may be made of a silicon oxide film.

The mask insulating film may be made of a silicon nitride film.

In the above semiconductor device, the n-type MIS transistor may further include a first extension region formed in a region outside the first FUSI gate electrode in the first active region, and a first source/drain region formed in a region outside the first sidewall insulating film in the first active region. The p-type MIS transistor may further include a second extension region formed in a region outside the second FUSI gate electrode in the second active region, and a second source/drain region formed in a region outside the second sidewall insulating film in the second active region.

The n-type MIS transistor may further include a first silicide film formed on the first source/drain region, and the p-type MIS transistor may further include a second silicide film formed on the second source/drain region.

In the above semiconductor device, the second metal silicide film may be richer in metal than the second metal silicide film.

In the above semiconductor device, the first metal silicide film may be made of NiSi or $NiSi_2$, and the second metal silicide film may be made of $Ni_{31}Si_{12}$, $Ni_3Si$, or $Ni_2Si$.

In the above semiconductor device, the first gate insulating film and the second gate insulating film may include a high dielectric film having a dielectric constant of at least 10.

In the above semiconductor device, the first gate insulating film and the second gate insulating film may contain a metal oxide.

In the above semiconductor device, the first gate insulating film and the second gate insulating film may contain at least one oxide of the oxide group consisting of an oxide containing hafnium, an oxide containing tantalum, an oxide containing lanthanum, and an oxide containing aluminum.

In the above semiconductor device, the first gate insulating film and the second gate insulating film may be made of at least one kind selected from rare earth metals such as hafnium oxide ($HfO_2$), hafnium silicate (HfSiO), hafnium silicate nitride (HfSiON), zirconium (Zr), titanium (Ti), tantalum (Ta), aluminum (Al), scandium (Sc), yttrium (Y), lanthanum (La), and other lanthanoids.

According to another aspect of the invention, a manufacturing method of a semiconductor device having an n-type MIS (Metal Insulator Semiconductor) transistor formed over a first active region of a semiconductor substrate and a p-type MIS transistor formed over a second active region of the semiconductor substrate includes the steps of: (a) sequentially forming a gate insulating film formation film and a silicon film on the semiconductor substrate; (b) after the step (a), patterning the gate insulating film formation film and the silicon film to form a first gate insulating film and a first gate electrode silicon film on the first active region and to form a second gate insulating film and a second gate electrode silicon film on the second active region; (c) after the step (b), fully siliciding the first gate electrode silicon film to form a first fully silicided (FUSI) gate electrode of a first metal silicide film over the first active region; and (d) after the step (b), fully siliciding the second gate electrode silicon film to form a second fully silicided (FUSI) gate electrode of a second metal silicide film over the second active region. The step (c) includes the step of forming the first FUSI gate electrode by a first silicidation step using a first metal film. The step (d) includes the step of forming the second FUSI gate electrode by a second silicidation step using the first metal film and a third silicidation step using a second metal film. A top surface of the first FUSI gate electrode is located lower than a top surface of the second FUSI gate electrode.

In the above manufacturing method, in the step (b), the first gate electrode silicon film and the second gate electrode silicon film may have a same thickness and may be formed integrally.

The above manufacturing method may further include the steps of: (e) before the steps (c) and (d), forming a protective film on the first gate electrode silicon film and exposing a top surface of the second gate electrode silicon film; and (f) after the step (e), fully siliciding the second gate electrode silicide film by the third silicidation step in the step (d) and then removing the protective film. After the step (f), the first FUSI gate electrode may be formed by the first silicidation step in the step (c) and the second FUSI gate electrode may be formed by the second silicidation step in the step (d).

The above manufacturing method may further include the step of: (g) after the step (b), forming the first FUSI gate electrode by the first silicidation step in the step (c) and fully siliciding the second gate electrode silicon film by the second silicidation step in the step (d), and then forming a mask insulating film on the first FUSI gate electrode. After the step (g), the second FUSI gate electrode may be formed by the third silicidation step in the step (d).

The mask insulating film may be made of a silicon nitride film.

The above manufacturing method may further include the steps of: (h) after the step (b) and before the steps (c) and (d), forming a first source/drain region in a region outside the first gate electrode silicon film in the first active region and forming a second source/drain region in a region outside the second gate electrode silicon film in the second active region; and (i) forming a first silicide film on the first source/drain region and forming a second silicide film on the second source/drain region.

In the above manufacturing method, the first metal film and the second metal film may contain at least one metal of the metal group consisting of nickel, cobalt, platinum, titanium, ruthenium, iridium, and ytterbium.

In the semiconductor device and the manufacturing method thereof according to the invention, a gate electrode formation film in an n-type MIS transistor formation region has the same thickness as that of a gate electrode formation film in a p-type MIS transistor formation region. Therefore, the thickness of both gate electrode formation films can be accurately adjusted to a desired value. As a result, a FUSI gate electrode made of a metal silicide film having a desired silicide composition ratio can be accurately formed in both a p-type MIS transistor and an n-type MIS transistor, and a desired threshold voltage can be accurately obtained for both transistors. Moreover, expansion of a silicide composition mixed region can be suppressed at the boundary between the gate electrode formation film in the n-type MIS transistor formation region and the gate electrode formation film in the p-type MIS transistor formation region.

DETAILED DESCRIPTION OF THE PREFERRED EMBODIMENTS

Hereinafter, embodiments of the invention will be described with reference to the accompanying drawings.

First Embodiment

A semiconductor device and a manufacturing method according to a first embodiment of the invention will now be described with reference to the figures.

First, the structure of the semiconductor device of the first embodiment will be described with reference to FIGS. 1A through 1C.

Figure 1A:
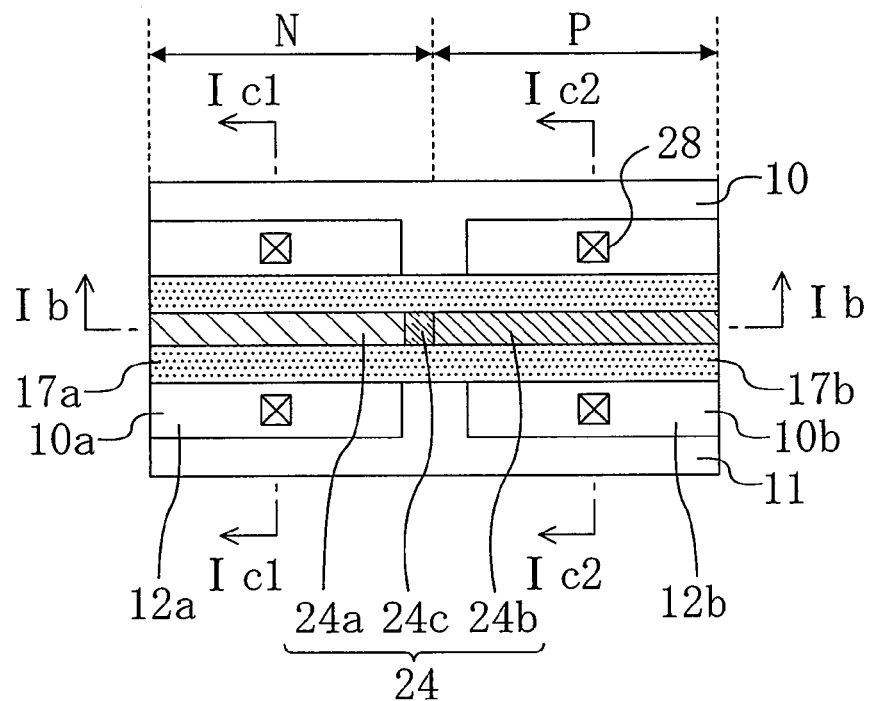
FIG. 1A is a plan view of the structure of a semiconductor device according to a first embodiment of the invention.

FIGS. 1A thorough 1C illustrate the structure of the semiconductor device of the first embodiment. FIG. 1A is a plan view and FIG. 1B is a cross-sectional view taken along line Ib-Ib in FIG. 1A. FIG. 1C shows a cross-sectional view taken along line Ic1-Ic1 on the left side of the figure and shows a cross-sectional view taken along line Ic2-Ic2 on the right side of the figure. It should be noted that some of elements shown in FIGS. 1B and 1C are not shown in FIG. 1A for convenience of illustration. In FIGS. 1A and 1B, the letter "N" on the left-hand side refers to an n-type MIS (Metal Insulator Semiconductor) transistor formation region and the letter "P" on the right-hand side refers to a p-type MIS transistor formation region.

As shown in FIG. 1A, a first active region 10a and a second active region 10b are formed in a semiconductor substrate 10.

The semiconductor substrate 10 is made of, for example, silicon. The first active region 10a and the second active region 10b are surrounded by an element isolation region 11 and form an n-type MIS transistor formation region and a p-type MIS transistor formation region, respectively. The element isolation region 11 is made of, for example, STI (shallow trench isolation) that is formed by forming an insulating film in a trench that divides the first active region 10a and the second active region 10b from each other.

A fully silicided (FUSI) gate electrode 24 is formed over the first active region 10a, the second active region 10b, and the element isolation region 11 so as to extend across the first active region 10a and the second active region 10b in a gate width direction. The FUSI gate electrode 24 is formed by fully siliciding a gate electrode material. The FUSI gate electrode 24 is formed by a first FUSI gate electrode 24a, a second FUSI gate electrode 24b, and a silicide composition mixed region 24c. The first FUSI gate electrode 24a is made of, for example, fully silicided (FUSI) NiSi and forms an n-type MIS transistor that is formed over the first active region 10a. The second FUSI gate electrode 24b is made of, for example, fully silicided (FUSI) $Ni_2Si$ and forms a p-type MIS transistor that is formed over the second active region 10b. The silicide composition mixed region 24c is located at the boundary between the first FUSI gate electrode 24a and the second FUSI gate electrode 24b. The first FUSI gate electrode 24a, the second FUSI gate electrode 24b, and the silicide composition mixed region 24c are formed as a continuous, integral electrode. For example, the silicide composition mixed region 24c has an intermediate composition between the NiSi FUSI composition of the first FUSI gate electrode 24a and the $Ni_2Si$ FUSI composition of the second FUSI gate electrode 24b.

A first sidewall (a first sidewall insulating film) 17a is formed on the side surface of the first FUSI gate electrode 24a. A second sidewall (a second sidewall insulating film) 17b is formed on the side surface of the second FUSI gate electrode 24b. The first sidewall 17a and the second sidewall 17b are made of, for example, a silicon nitride film. A first source/drain region 18A extends from under the first sidewall 17a toward outside in the first active region 10a, and a second source/drain region 18B extends from under the second sidewall 17b toward outside in the second active region 10b (see FIG. 1C described below). A silicide layer (not shown in FIGS. 1A; 19a and 19b in FIG. 1C) is formed at the respective surfaces of the first source/drain region 18A and the second source/drain region 18B. Contact plugs 28 extend through an underlying protective film (not shown in FIG. 1A; 20 in FIG. 1C) and first and second interlayer insulating films (not shown in FIGS. 1A; 21 and 26 in FIG. 1C). The contact plugs 28 connect to the first source/drain region 18A and the second source/drain region 18B through the silicide layers 19a and 19b, respectively.

Figure 1B:
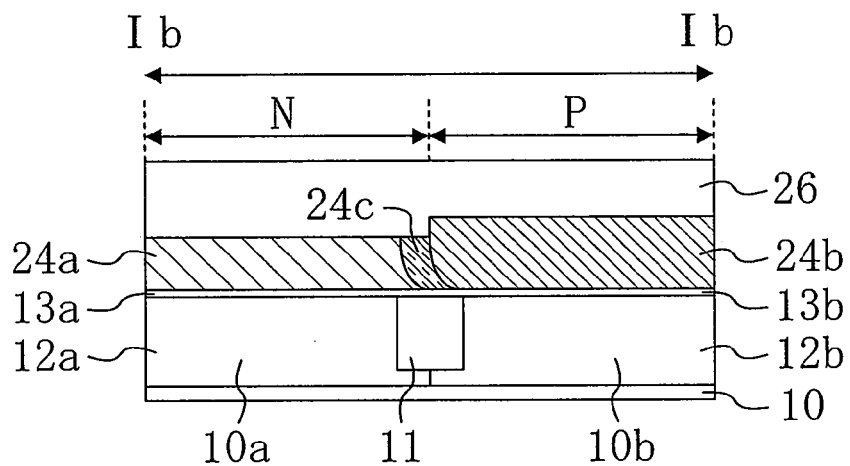
FIG. 1B is a cross-sectional view of a main part of the semiconductor device in a gate width direction, and FIG. 1C show cross-sectional views of a main part of the semiconductor device in a gate length direction.

FIG. 1B shows in cross section the FUSI gate electrode 24 in the gate width direction. As shown in FIG. 1B, the FUSI gate electrode 24 is formed by the first FUSI gate electrode 24a, the silicide composition mixed region 24c, and the second FUSI gate electrode 24b. The first FUSI gate electrode 24a is formed over the first active region 10a and forms an n-type MIS transistor. The silicide composition mixed region 24c is formed over the element isolation region 11. The second FUSI gate electrode 24b is formed over the second active region 10b and forms a p-type MIS transistor. The first FUSI gate electrode 24a is made of, for example, NiSi FUSI and the second FUSI gate electrode 24b is made of, for example, $Ni_2Si$. The first active region 10a is formed by forming a p-type well 12a and the second active region 10b is formed by forming an n-type well 12b. A second interlayer insulating film 26 is formed on the first FUSI gate electrode 24a, the silicide composition mixed region 24c, and the second FUSI gate electrode 24b. The silicide composition mixed region 24c has a width of 100 nm or less in the gate width direction, whereas the silicide composition mixed region in a corresponding conventional example has a width of about 150 nm. Expansion of the silicide composition mixed region 24c of this embodiment is thus suppressed as compared to the conventional example. The invention can thus avoid the conventional problems caused by the silicide composition mixed region. For example, the invention does not need a larger element isolation region that hinders dimensional reduction and prevents degradation of transistor driving capability.

Figure 1C:
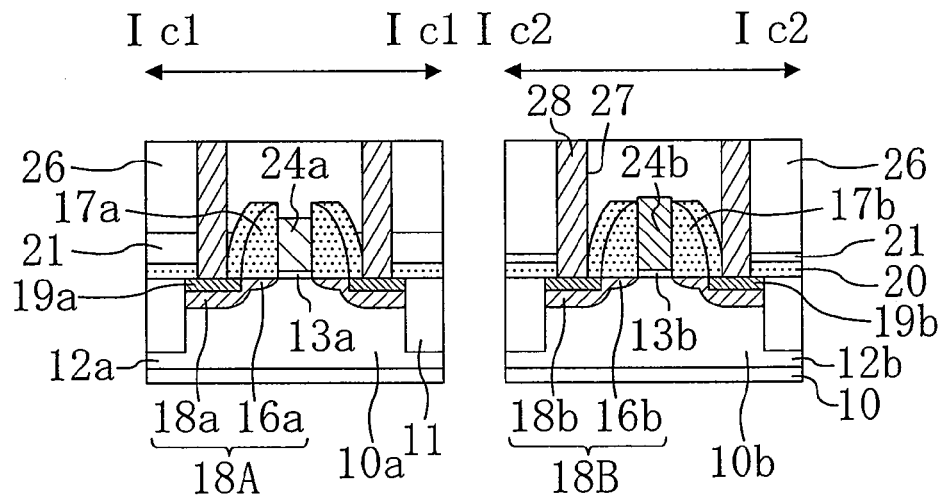

In the cross-sectional views shown on the left and right sides of FIG. 1C, the first active region 10a having the p-type well 12a and the second active region 10b having the n-type well 12b are formed in the semiconductor substrate 10. The first active region 10a and the second active region 10b are surrounded by the element isolation region 11. The first FUSI gate electrode 24a of the FUSI gate electrode 24 is formed on the first active region 10a with a first gate insulating film 13a interposed therebetween. The second FUSI gate electrode 24b of the FUSI gate electrode 24 is formed on the second active region 10b with a second gate insulating film 13b interposed therebetween. The first gate insulating film 13a and the second gate insulating film 13b are made of, for example, a high dielectric film. It should be noted that the structure of this embodiment is different from that of the conventional example in the following point: in this embodiment, the top surface of the first FUSI gate electrode 24a in the n-type MIS transistor formation region is located lower than the top surface of the second FUSI gate electrode 24b in the p-type MIS transistor formation region. In the conventional example, however, the top surface of the FUSI gate electrode in the n-type MIS transistor formation region is located higher than the top surface of the FUSI gate electrode in the p-type MIS transistor formation region.

An n-type source/drain region (an n-type extension region or an n-type LDD (lightly doped drain) region) 16a having a relatively shallow junction depth is formed in a region outside the first FUSI gate electrode 24a in the first active region 10a. A p-type source/drain region (a p-type extension region or a p-type LDD region) 16b having a relatively shallow junction depth is formed in a region outside the second FUSI gate electrode 24b in the second active region 10b. The first sidewall 17a is formed on the side surface of the first FUSI gate electrode 24a and the second sidewall 17b is formed on the side surface of the second FUSI gate electrode 24b.

An n-type source/drain region 18a having a relatively deep junction depth (a deeper junction depth than that of the n-type source/drain region 16a) is formed in a region outside the first sidewall 17a in the first active region 10a. A p-type source/drain region 18b having a relatively deep junction depth (a deeper junction depth than that of the p-type source/drain region 16b) is formed in a region outside the second sidewall 17b in the second active region 10b. The first source/drain region 18A is formed by the n-type source/drain region 16a having a relatively shallow junction depth and the n-type source/drain region 18a having a relatively deep junction depth. The second source/drain region 18B is formed by the p-type source/drain region 16b having a relatively shallow junction depth and the p-type source/drain region 18b having a relatively deep junction depth.

A silicide layer 19a is formed at the surface of the first source/drain region 18A in a region outside the first sidewall 17a. A silicide layer 19b is formed at the surface of the second source/drain region 18B in a region outside the second sidewall 17b. An underlying protective film 20 is formed on the element isolation region 11 and the silicide layers 19a and 19b and on the respective side surfaces of the first FUSI gate electrode 24a and the second FUSI gate electrode 24b of the FUSI gate electrode 24 (see FIG. 1A). The underlying protective film 20 is made of, for example, a silicon nitride film.

A first interlayer insulating film 21 and a second interlayer insulating film 26 are sequentially formed on the underlying protective film 20 so as to cover the first sidewall 17a and the first FUSI gate electrode 24a and to cover the second sidewall 17b and the second FUSI gate electrode 24b. The first interlayer insulating film 21 and the second interlayer insulating film 26 are made of, for example, a silicon oxide film. A contact plug 28 that is connected to the first source/drain region 18A through the silicide film 19a and a contact plug 28 that is connected to the second source/drain region 18B through the silicide film 19b are formed in the second interlayer insulating film 26, the first interlayer insulating film 21, and the underlying protective film 20. These contact plugs 28 are formed by filling respective contact holes 27 with an electrically conductive material such as tungsten.

Hereinafter, a manufacturing method of a semiconductor device according to the first embodiment of the invention will be described with reference to FIGS. 2A through 2E, FIGS. 3A through 3D, FIGS. 4A through 4E, and FIGS. 5A and 5B. FIGS. 2A through 2E, FIGS. 3A through 3D, and FIG. 5B are cross-sectional views of a main part of a semiconductor device in the gate length direction and sequentially illustrate the steps of the manufacturing method of the semiconductor device according to the first embodiment of the invention. In other words, FIGS. 2A through 2E, FIGS. 3A through 3D, and FIG. 5B are cross-sectional views taken along line Ic1-Ic1 and Ic2-Ic2 of FIG. 1A and correspond to the cross-sectional views of FIG. 1C. FIGS. 4A through 4E and FIG. 5A are cross-sectional views of a main part of a semiconductor device in the gate width direction and sequentially illustrate the steps of the manufacturing method of the semiconductor device according to the first embodiment of the invention. In other words, FIGS. 4A through 4E and FIG. 5A are cross-sectional views taken along line Ib-Ib in FIG. 1A and thus correspond to the cross-sectional view of FIG. 1B. In FIGS. 4A through 4E and FIG. 5A, the letter "N" on the right-hand side refers to an n-type MIS transistor formation region, and the letter "P" on the left-hand side refers to a p-type MIS transistor formation region. The step shown in FIG. 3D corresponds to the step shown in FIG. 4A, and the step shown in FIG. 5A corresponds to the step shown in FIG. 5B.

Figure 2A:
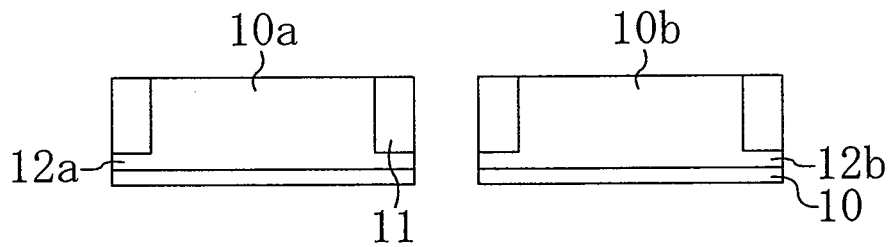
FIGS. 2A, 2B, 2C, 2D, and 2E show cross-sectional views of a main part of the semiconductor device in the gate length direction, sequentially illustrating the steps of a manufacturing method of a semiconductor device according to the first embodiment of the invention.

First, as shown in FIG. 2A, an element isolation region 11 is selectively formed above a semiconductor substrate 10 such as a p-type silicon substrate by, for example, a shallow trench isolation (STI) method. The element isolation region 11 is thus formed by forming an insulating film in a trench. As a result, a first active region 10a is formed in an n-type MIS transistor formation region and a second active region 10b is formed in a p-type MIS transistor formation region. The first active region 10a and the second active region 10b are surrounded by the element isolation region 11 and are made of the semiconductor substrate 10. Thereafter, p-type impurities such as B (boron) are implanted into the n-type MIS transistor formation region in the semiconductor substrate 10 and n-type impurities such as P (phosphorus) are implanted into the p-type MIS transistor formation region in the semiconductor substrate 10 by a lithography method and an ion implantation method. The semiconductor substrate 10 is then heat treated to form a p-type well region 12a in the n-type MIS transistor formation region in the semiconductor substrate 10 and an n-type well region 12b in the p-type MIS transistor formation region in the semiconductor substrate 10. For example, the heat treatment is conducted at 850° C. for thirty seconds.

Figure 2B:
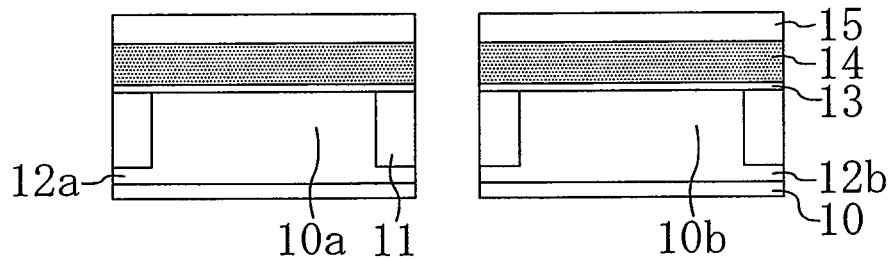

As shown in FIG. 2B, the surface of the semiconductor substrate 10 is then cleaned with diluted hydrofluoric acid and the resultant semiconductor substrate 10 is then heat treated in an oxidizing atmosphere at, for example, about 600° C. to about 1,000° C. to form an underlying film of silicon oxide (not shown). Thereafter, a gate insulating film formation film 13 is deposited on the underlying film by using, for example, a MOCVD (Metal Organic Chemical Vapor Deposition) method. A gate electrode formation film 14 is then deposited on the gate insulating film formation film 13 by, for example, a CVD (Chemical Vapor Deposition) method. A protective film 15 is then formed on the gate electrode formation film 14 by a CVD method or the like. For example, the gate insulating film formation film 13 is a high dielectric film with a thickness of 2 nm, the gate electrode formation film 14 is a polysilicon film with a thickness of 60 nm, and the protective film 15 is a silicon oxide film with a thickness of 40 nm. Note that the underlying film becomes a part of the gate insulating film, but need not necessarily be formed.

Figure 2C:
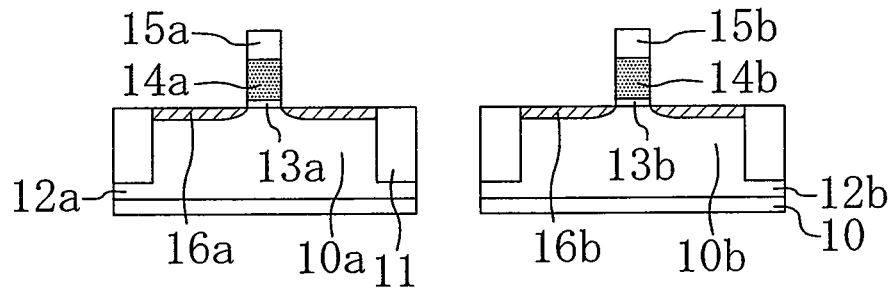

As shown in FIG. 2C, a resist mask pattern (not shown) having a gate pattern shape is formed on the protective film 15 by a photolithography method. The protective film 15, the gate electrode formation film 14, and the gate insulating film formation film 13 are then selectively etched by a dry etching method by using the resist mask pattern as a mask. As a result, a first gate insulating film 13a, a first gate electrode formation portion (a first gate electrode silicon film) 14a, and a first protective film 15a are formed in the n-type MIS transistor formation region, and a second gate insulating film 13b, a second gate electrode formation portion (a second gate electrode silicon film) 14b, and a second protective film 15b are formed in the p-type MIS transistor formation region. A resist mask pattern (not shown) is then formed so as to cover the p-type MIS transistor formation region, and n-type impurities are implanted into the active region 10a of the n-type MIS transistor formation region by using the first gate electrode formation portion 14a and the first protective film 15a as a mask. As a result, an n-type source/drain region 16a having a relatively shallow junction depth is formed on both sides of the first gate electrode formation portion 14a in the active region 10a in a self-aligned manner. Similarly, a resist mask pattern (not shown) is formed so as to cover the n-type MIS transistor formation region, and p-type impurities are implanted into the active region 10b of the p-type MIS transistor formation region by using the second gate electrode formation portion 14b and the second protective film 15b as a mask. As a result, a p-type source/drain region 16b having a relatively shallow junction depth is formed on both sides of the second gate electrode formation portion 14b in the active region 10b in a self-aligned manner.

Figure 2D:
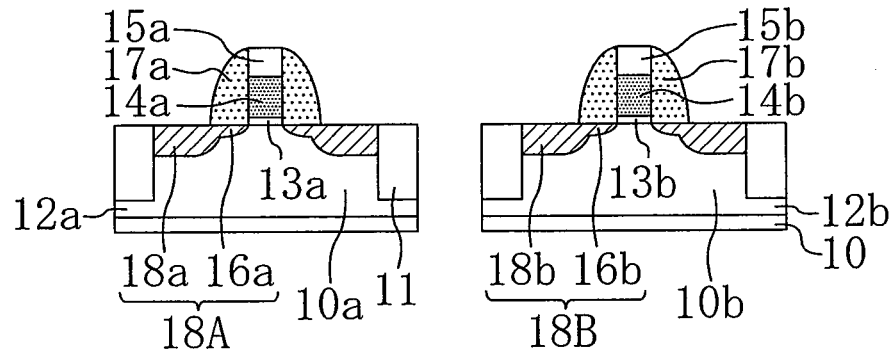

As shown in FIG. 2D, a silicon nitride film is then deposited with a thickness of, for example, 50 nm over the whole surface of the semiconductor substrate 10 by a CVD method or the like. The silicon nitride film thus deposited is then anisotropically etched to form a first sidewall (a first sidewall insulating film) 17a on the respective side surfaces of the first gate electrode formation portion 14a and the first protective film 15a and a second sidewall (a second sidewall insulating film) 17b on the respective side surfaces of the second gate electrode formation portion 14b and the second protective film 15b. A resist mask pattern (not shown) is then formed so as to cover the p-type MIS transistor formation region, and n-type impurities are implanted into the active region 10a of the n-type MIS transistor formation region by using the first protective film 15a and the first sidewall 17a as a mask. Similarly, a resist mask pattern (not shown) is formed so as to cover the n-type MIS transistor formation region, and p-type impurities are implanted into the active region 10b of the p-type MIS transistor formation region by using the second protective film 15b and the second sidewall 17b as a mask. Thereafter, by heat treatment, an n-type source/drain region 18a is formed in a region outside the first sidewall 17a in the active region 10a of the n-type MIS transistor formation region in a self-aligned manner, and a p-type source/drain region 18b is formed in a region outside the second sidewall 17b in the active region 10b of the p-type MIS transistor formation region in a self-aligned manner. The n-type source/drain region 18a has a deeper junction depth than that of the n-type source/drain region 16a, and the p-type source/drain region 18b has a deeper junction depth than that of the p-type source/drain region 16b. A first drain/source region 18A is formed by the n-type source/drain region 16a having a relatively shallow junction depth and the n-type source/drain region 18a having a relatively deep junction depth. A second drain/source region 18B is formed by the p-type source/drain region 16b having a relatively shallow junction depth and the p-type source/drain region 18b having a relatively deep junction depth.

Figure 2E:
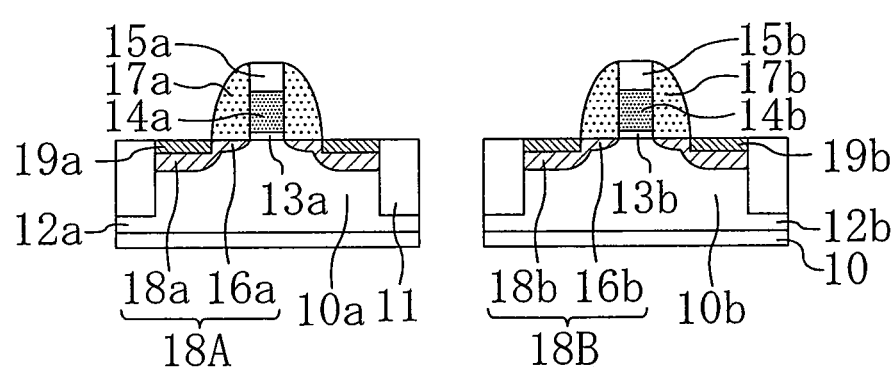

As shown in FIG. 2E, a natural oxide film (not shown) is then removed from the respective surfaces of the first source/drain region 18A and the second source/drain region 18B, and a metal film (not shown) is deposited over the whole surface of the semiconductor substrate 10 by a sputtering method. For example, the metal film is made of nickel with a thickness of 10 nm. Thereafter, the semiconductor substrate 10 is subjected to a first RTA (Rapid Thermal Annealing) process at 320° C. in a nitrogen atmosphere to cause a reaction between silicon in each source/drain region 18A, 18B and nickel of the metal film for metal silicidation. The semiconductor substrate 10 is then immersed in an etchant, a mixed solution of sulfuric acid and hydrogen peroxide solution, to remove the unreacted metal film remaining on the element isolation region 11, the protective films 15a, 15b, the sidewalls 17a, 17b, and the like. Thereafter, the semiconductor substrate 10 is subjected to a second RTA process at a temperature higher than the temperature of the first RTA process (e.g., 550° C.).

A silicide film 19a is thus formed in the n-type MIS transistor formation region by the reaction between the upper portion of the first source/drain region 18A and the metal film. Similarly, a silicide film 19b is formed in the p-type MIS transistor formation region by the reaction between the upper portion of the second source/drain region 18B and the metal film.

Figure 3A:
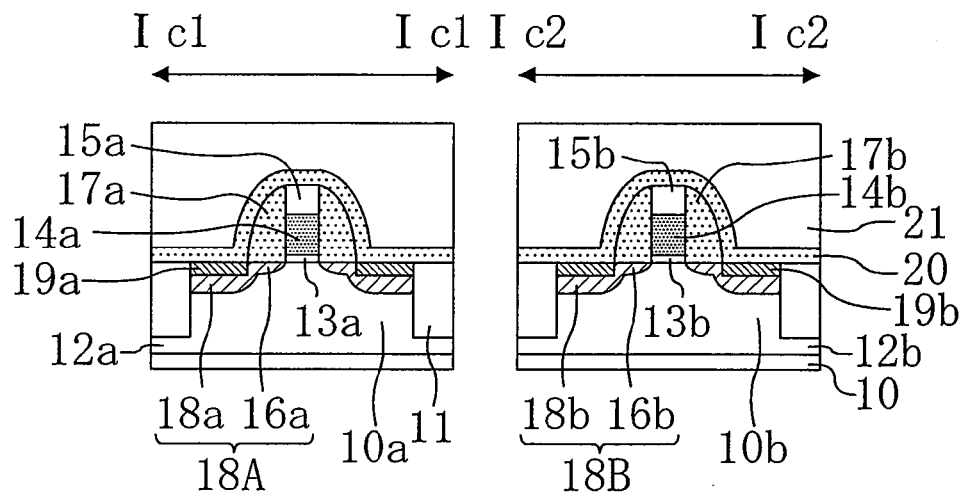
FIGS. 3A, 3B, 3C, and 3D show cross-sectional views of a main part of the semiconductor device in the gate length direction, sequentially illustrating the steps of the manufacturing method of the semiconductor device according to the first embodiment of the invention.

As shown in FIG. 3A, an underlying protective film 20 is then deposited over the whole surface of the semiconductor substrate 10 by an ALD (Atomic Layer Deposition) method or a plasma CVD method. A first interlayer insulating film 21 is then formed on the underlying protective film 20, and the surface of the first interlayer insulating film 21 is planarized by a CMP (Chemical Mechanical Polishing) method. For example, the underlying protective film 20 is a silicon nitride film with a thickness of 20 nm and the first interlayer insulating film 21 is a silicon oxide film.

Figure 3B:
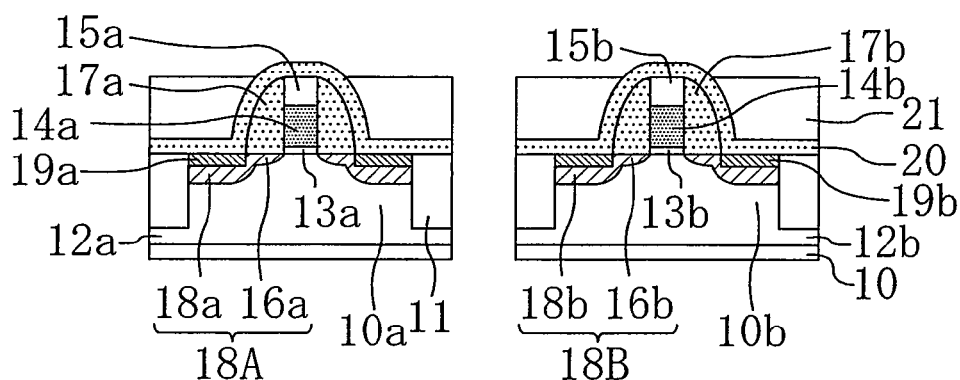

As shown in FIG. 3B, the first interlayer insulating film 21 is then etched by a dry etching method or a wet etching method so as to expose the underlying protective film 20 on the first protective film 15a and the second protective film 15b. Etching conditions are determined so that the selectivity to the silicon nitride film is high.

Figure 3C:
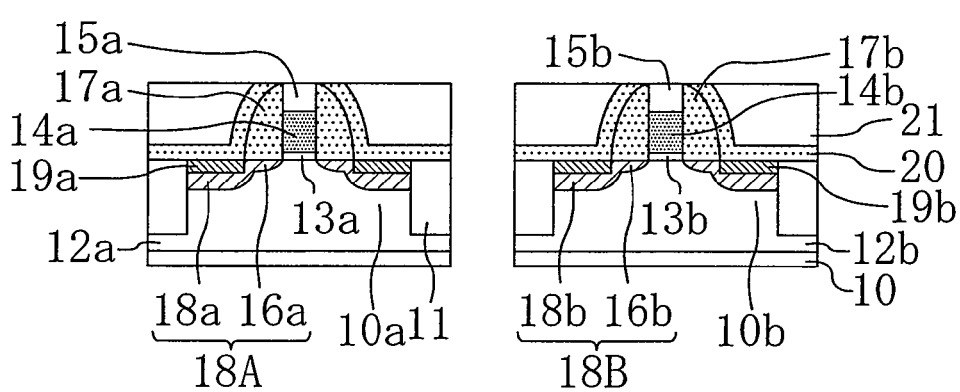

As shown in FIG. 3C, the underlying protective film 20 on the first protective film 15a and the second protective film 15b is then removed by a dry etching method or a wet etching method so as to expose the respective top surfaces of the first protective film 15a and the second protective film 15b. Etching conditions are determined so that the selectivity to the silicon oxide film is high.

Figure 3D:
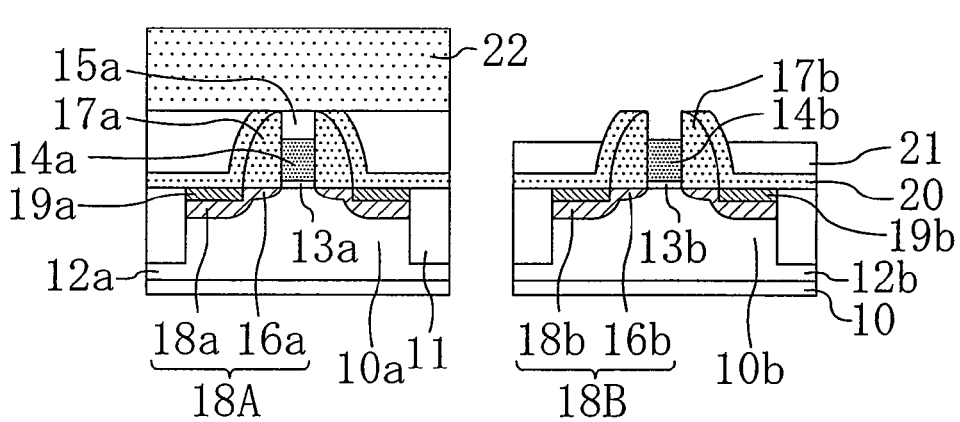
Figure 4A:
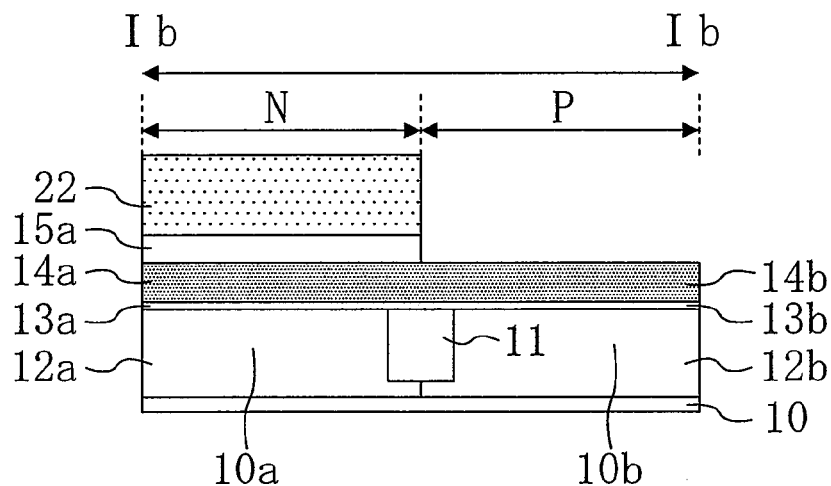
FIGS. 4A, 4B, 4C, 4D, and 4E are cross-sectional views of a main part of the semiconductor device in the gate width direction, sequentially illustrating the steps of the manufacturing method of the semiconductor device according to the first embodiment of the invention.

As shown in FIG. 3D and FIG. 4A, a resist mask pattern 22 is formed so as to cover the n-type MIS transistor formation region. The second protective film 15b on the second gate electrode formation portion 14b is then removed by a dry etching method or a wet etching method so as to expose the top surface of the second gate electrode formation portion 14b. Etching conditions are determined so that the selectivity to the silicon nitride film and the polysilicon film is high. Note that when the second protective film 15b is removed by etching, the upper portion of the first interlayer insulating film 21 is also etched away simultaneously. FIG. 4A is a cross-sectional view corresponding to the step of FIG. 3D and taken along line Ib-Ib in FIG. 1A.

Figure 4B:
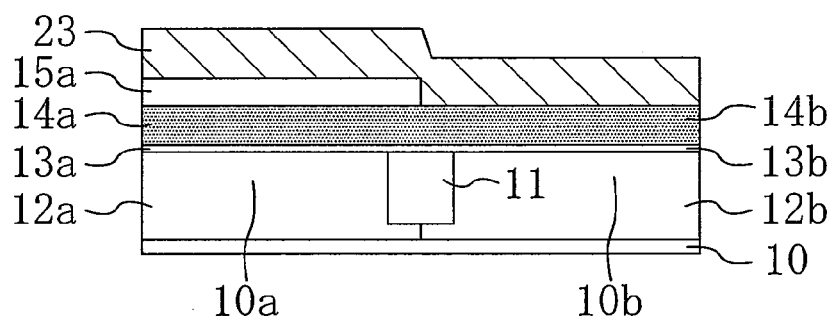

As shown in FIG. 4B, the resist mask pattern 22 is then removed, and a first metal film 23 (a second full silicidation metal film) is deposited over the whole surface of the semiconductor substrate 10 by, for example, a sputtering method so as to cover the first protective film 15a in the n-type MIS transistor formation region and the second gate electrode formation portion 14b in the p-type MIS transistor formation region. For example, the first metal film 23 is made of nickel with a thickness of 70 nm.

Figure 4C:
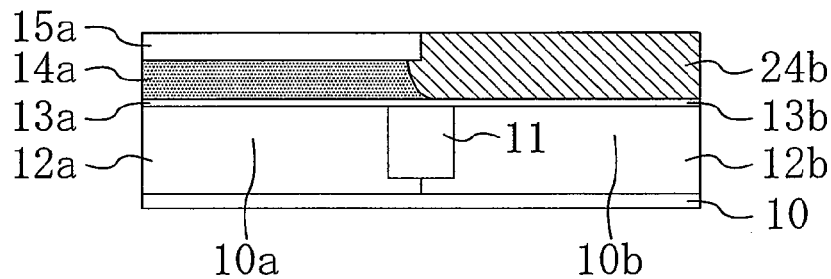

As shown in FIG. 4C, the semiconductor substrate 10 is then subjected to an RTA process at 380° C. in a nitrogen atmosphere to cause a reaction between silicon of the second gate electrode formation portion 14b in the p-type MIS transistor formation region and nickel of the first metal film 23. The second gate electrode formation portion 14b is thus fully silicided to form a second FUSI gate electrode 24b having a composition of, for example, $Ni_2Si$. Since there is the first protective film 15a on the first gate electrode formation portion 14a, the first gate electrode formation portion 14a does not react with the first metal film 23. The semiconductor substrate 10 is then immersed in an etchant, a mixed solution of sulfuric acid and hydrogen peroxide solution, to remove the unreacted first metal film 23 remaining on the first interlayer insulating film 21, the underlying protective film 20, the first protective film 15a, the first sidewall 17a, the second sidewall 17b, and the like.

Figure 4D:
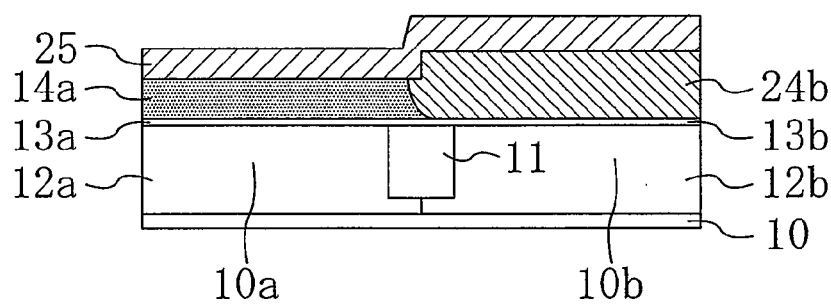

As shown in FIG. 4D, the first protective film 15a is then etched away from the first gate electrode formation portion 14a in the n-type MIS transistor formation region. Thereafter, a second metal film 25 (a first full silicidation metal film) is deposited over the whole surface of the semiconductor substrate 10 so as to cover the first gate electrode formation portion 14a in the n-type MIS transistor formation region and the second FUSI gate electrode 24b in the p-type MIS transistor formation region. For example, the second metal film 25 is made of nickel with a thickness of 40 nm.

Figure 4E:
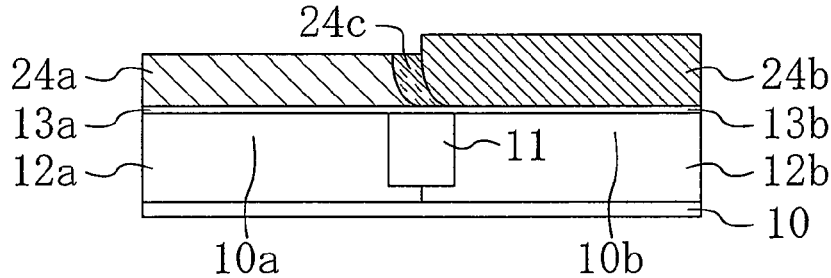

As shown in FIG. 4E, the semiconductor substrate 10 is then subjected to an RTA process at 380° C. in a nitrogen atmosphere to cause a reaction between silicon of the first gate electrode formation portion 14a in the n-type MIS transistor formation region and nickel of the second metal film 25. The first gate electrode formation portion 14a is thus fully silicided to form a first FUSI gate electrode 24a having a composition of, for example, NiSi. In this process, Ni-richer $Ni_{31}Si_{12}$ can be formed by causing a reaction between the second FUSI gate electrode 24b in the p-type MIS transistor formation region and nickel of the second metal film 25, or $Ni_3Si$ can be formed by using a higher annealing temperature.

Thereafter, the semiconductor substrate 10 is immersed in an etchant, a mixed solution of sulfuric acid and hydrogen peroxide solution, to remove the unreacted second metal film 25 remaining on the first interlayer insulating film 21, the underlying protective film 20, the first sidewall 17a, the second sidewall 17b, and the like. Note that, in this embodiment, the top surface of the first FUSI gate electrode 24a in the n-type MIS transistor formation region is located lower than the top surface of the second FUSI gate electrode 24b in the p-type MIS transistor formation region.

An additional annealing process may be conducted at 500° C. for about 30 seconds in a nitrogen atmosphere in order to obtain a uniform silicide composition in each of the first FUSI gate electrode 24a and the second FUSI gate electrode 24b. This process can reduce the possibility that the gate electrode has an uneven silicide composition in the vertical direction. For example, this process can reduce the possibility that the first FUSI gate electrode 24a in the n-type MIS transistor formation region has a Ni-rich silicide composition in its upper portion and has silicon remaining in its lower portion near the gate insulating film. As a result, a uniform silicide composition can be obtained. Note that in the step of fully siliciding the first gate electrode formation portion 14a to form the first FUSI gate electrode 24a, a silicide composition mixed region 24c is formed at the boundary between the first FUSI gate electrode 24a in the n-type MIS transistor formation region and the second FUSI gate electrode 24b in the p-type MIS transistor formation region. However, since the silicon film of the first gate electrode formation portion 14a does not have a difference in thickness at the boundary with the second FUSI gate electrode 24b, expansion of the silicide composition mixed region 24c can be suppressed as compared to a conventional manufacturing method. More specifically, the silicide composition mixed region 24c has a width of 100 nm or less in the gate width direction, whereas a silicide composition mixed region in a corresponding conventional example has a width of about 150 nm. In this embodiment, expansion of the silicide composition mixed region 24c is thus suppressed as compared to the conventional example. Accordingly, the invention can avoid the conventional problems caused by the silicide composition mixed region. For example, the invention does not need a larger element isolation region that hinders dimensional reduction and prevents degradation of transistor driving capability. For example, the silicide composition mixed region 24c has an intermediate composition between the NiSi FUSI composition of the first FUSI gate electrode 24a and the $Ni_{31}Si_{12}$ or $Ni_3Si$ FUSI composition of the second FUSI gate electrode 24b. In the step of fully siliciding the first gate electrode formation portion 14a to form the first FUSI gate electrode 24a, the second FUSI gate electrode 24b has a stepped portion at the boundary with the first gate electrode formation portion 14a. When the second FUSI gate electrode 24b reacts with nickel of the second metal film 25, nickel is supplied also from the side surface of the stepped portion, causing oversupply of nickel. However, since nickel is saturated with Ni-rich $Ni_{31}Si_{12}$ or $Ni_3Si$ FUSI, the stepped portion of the second FUSI gate electrode 24b does not cause any disadvantages.

Figure 5A:
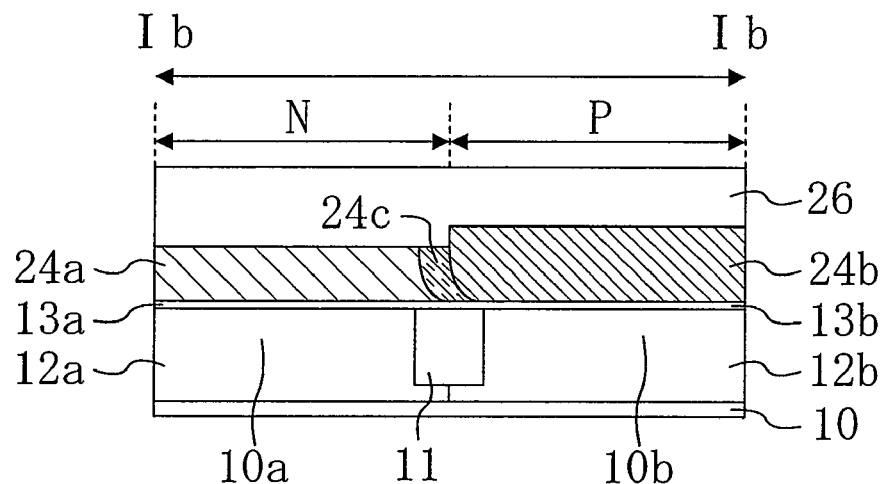
FIG. 5A is a cross-sectional view of a main part of the semiconductor device in the gate width direction and FIG. 5B show cross-sectional views of a main part of the semiconductor device in the gate length direction, sequentially illustrating the steps of the manufacturing method of the semiconductor device according to the first embodiment of the invention.

As shown in FIG. 5A, a second interlayer insulating film 26 is then formed over the whole surface of the semiconductor substrate 10 by, for example, a CVD method so as to cover the first and second FUSI gate electrodes 24a and 24b. The surface of the second interlayer insulating film 26 is then planarized by a CMP method.

Thereafter, as in a common manufacturing method of a semiconductor device having a MIS transistor, a resist mask pattern (not shown) is formed on the second interlayer insulating film 26. By using the resist mask pattern as a mask, contact holes 27 are formed in the underlying protective film 20, the first interlayer insulating film 21, and the second interlayer insulating film 26 by a dry etching method so as to reach the respective top surfaces of the silicide films 19a and 19b formed at the respective surfaces of the source/drain regions 18A and 18B. In this process, an overetch amount of each silicide film 19a, 19b can be reduced by using a two-step etching method in which etching is stopped once when the underlying protective film 20 made of a silicon nitride film is exposed.

Figure 5B:
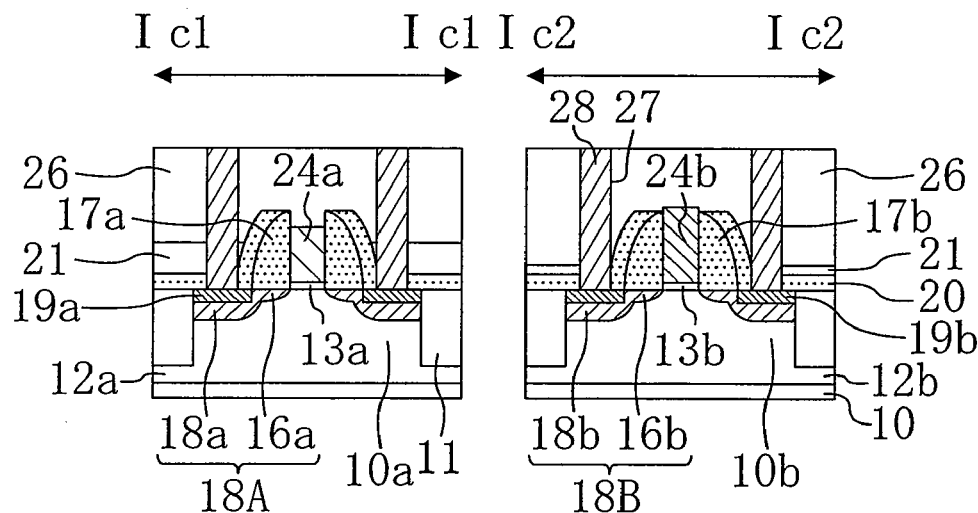

A barrier metal film is then formed on the bottom and sidewall of each contact hole by a sputtering method or a CVD method. The barrier metal film is formed by sequentially depositing titanium and titanium nitride. A tungsten film is then deposited on the second interlayer insulating film 26 by a CVD method so as to fill each contact hole. The tungsten film that is present outside each contact hole is then removed by a CMP method. As shown in FIG. 5B, the tungsten film is formed in each contact hole with the barrier metal film interposed therebetween, and a contact plug 28 is thus formed in each contact hole. A metal wiring (not shown) for electrically connecting to each contact plug is then formed on the second interlayer insulating film 26. FIG. 5B shows cross-sectional views corresponding to the step of FIG. 5A and taken along line Ic1-Ic1 and line Ic2-Ic2 in FIG. 1A. The semiconductor device of this embodiment can thus be manufactured.

As has been described above, according to the manufacturing method of the semiconductor device of this embodiment, a gate electrode formation film in a p-type MIS transistor formation region is first fully silicided and then a gate electrode formation film in an n-type MIS transistor formation region is fully silicided. Therefore, desired metal films that are required to form an n-type MIS transistor and a p-type MIS transistor can be individually selected, and a FUSI gate electrode made of a metal silicide having a desired silicide composition ratio can be accurately implemented in both transistors. Moreover, the silicon film does not initially have a stepped portion at the boundary between the gate electrode formation film in the n-type MIS transistor formation region and the gate electrode formation film in the p-type MIS transistor formation region. Therefore, expansion of the silicide composition mixed region at the boundary can be suppressed.

Note that, in this embodiment, the second FUSI gate electrode 24b having a composition of, for example, $Ni_2Si$ is formed in the p-type MIS transistor formation region by fully siliciding the second gate electrode formation portion 14b by causing a reaction between silicon of the second gate electrode formation portion 14b and nickel of the first metal film 23. However, Ni-richer $Ni_{31}Si_{12}$ or $Ni_3Si$ may alternatively be formed in this step by changing the Ni film thickness and the annealing conditions.

Second Embodiment

Hereinafter, a semiconductor device and a manufacturing method thereof according to a second embodiment of the invention will be described with reference to the figures. Note that the differences between the first embodiment and the second embodiment will be mainly described below and description of the same parts will be omitted as appropriate.

The semiconductor device and the manufacturing method thereof according to the second embodiment are different from the semiconductor device and the manufacturing method thereof according to the first embodiment in the following points:

In the manufacturing method of the first embodiment, the second protective film 15b formed on the second gate electrode formation portion 14b in the p-type MIS transistor formation region is removed, and the second gate electrode formation portion 14b and the first metal film 23 are caused to react with each other to form the second FUSI gate electrode 24b. Thereafter, the first protective film 15a formed on the first gate electrode formation portion 14a in the n-type MIS transistor formation region is removed, and the first gate electrode formation portion 14a and the second metal film 25 are caused to react with each other to form the second FUSI gate electrode 24a. In other words, the manufacturing method of the first embodiment is characterized in that full silicidation in the p-type MIS transistor formation region is conducted earlier than full silicidation in the n-type MIS transistor formation region, and the semiconductor device of the first embodiment has structural characteristics obtained by this manufacturing method.

On the other hand, in the manufacturing method of the semiconductor device according to the second embodiment, when a first gate electrode formation portion 14a in an n-type MIS transistor formation region is caused to react with a first metal film 23 for full silicidation, a second gate electrode formation portion 14b in a p-type MIS transistor formation region is simultaneously caused to react with the first metal film 23 for full silicidation. Thereafter, a first FUSI gate electrode 24a in the n-type MIS transistor formation region is covered with a mask insulating film 29, and only a FUSI gate electrode in the p-type MIS transistor formation region is caused to react with a second metal film 25 to form a second FUSI gate electrode 24b. The semiconductor device of the second embodiment has structural characteristics obtained by this manufacturing method.

Figure 6A:
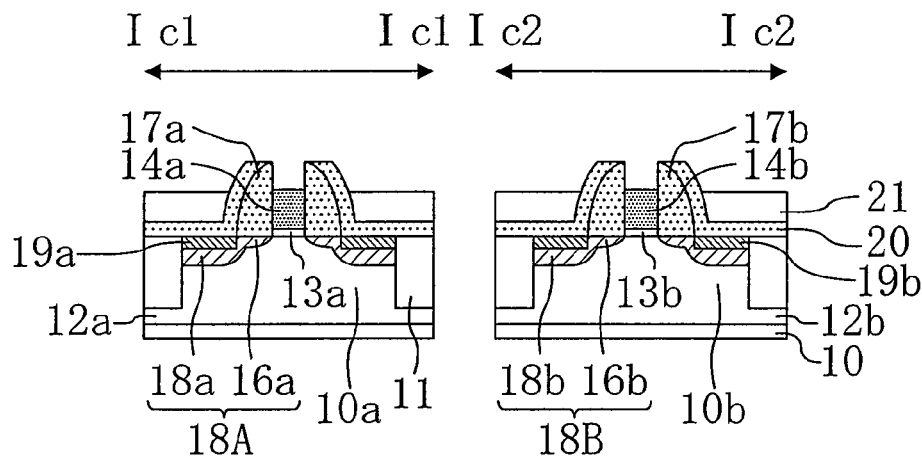
FIG. 6A show cross-sectional views of a main part of a semiconductor device in a gate length direction and FIGS. 6B, 6C, 6D, and 6E are cross-sectional views of a main part of the semiconductor device in a gate width direction, sequentially illustrating the steps of a manufacturing method of a semiconductor device according to a second embodiment of the invention.
Figure 6B:
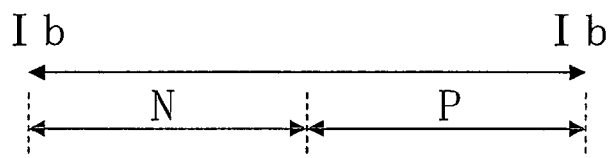

Hereinafter, the manufacturing method of the semiconductor device according to the second embodiment will be described with reference to FIGS. 6A through 6E and FIGS. 7A through 7C. FIGS. 6A and 7C are cross-sectional views of a main part of a semiconductor device in a gate length direction, sequentially illustrating the steps of the manufacturing method of the semiconductor device according to the second embodiment. FIGS. 6B through 6E and FIGS. 7A and 7B are cross-sectional views of a main part of the semiconductor device in the gate width direction, sequentially illustrating the steps of the manufacturing method of the semiconductor device according to the second embodiment. In FIG. 6B, the letter "N" on the left-hand side refers to an n-type MIS transistor formation region and the letter "P" on the right-hand side shows a p-type MIS transistor formation region. In FIGS. 6A through 6E and FIGS. 7A through 7C, the same elements as those of the semiconductor device of the first embodiment are denoted with the same reference numerals and characters and description thereof will not be repeated.

In the manufacturing method of the second embodiment, the steps of FIGS. 2A through 2E and FIGS. 3A through 3C are first conducted sequentially.

As shown in FIG. 6A, the first protective film 15a formed on the first gate electrode formation portion 14a and the second protective film 15b formed on the second gate electrode formation portion 14b are removed by a dry etching method or a wet etching method so as to expose the respective top surfaces of the first gate electrode formation portion 14a and the second gate electrode formation portion 14b. Etching conditions are determined so that the selectivity to the silicon nitride film and the polysilicon film is high. Note that the upper portion of the first interlayer insulating film 21 is simultaneously etched away when the first protective film 15a and the second protective film 15b are removed.

As shown in FIG. 6B, a first metal film 23 (corresponding to a first full silicidation metal film in the second embodiment) is deposited over the whole surface of the semiconductor substrate 10 by, for example, a sputtering method so as to cover the second gate electrode formation portion 14a in the n-type MIS transistor formation region and the second gate electrode formation portion 14b in the p-type MIS transistor formation region. For example, the first metal film 23 is made of nickel with a thickness of 40 nm.

Figure 6C:
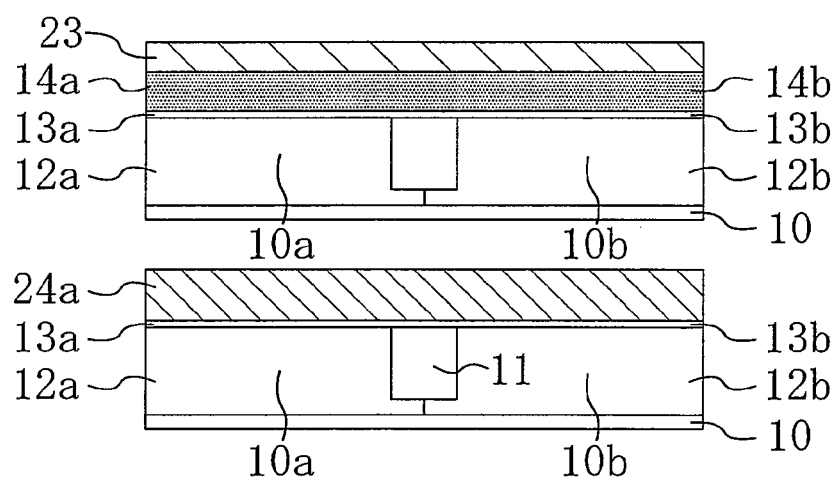

As shown in FIG. 6C, the semiconductor substrate 10 is then subjected to an RTA process at 380° C. in a nitrogen atmosphere to cause a reaction between silicon of the first gate electrode formation portion 14a in the n-type MIS transistor formation region and nickel of the first metal film 23 and between silicon of the second gate electrode formation portion 14b in the p-type MIS transistor formation region and nickel of the first metal film 23. The first gate electrode formation portion 14a and the second gate electrode formation portion 14b are thus fully silicided to form a first FUSI gate electrode 24a on the n-type MIS transistor formation region and the p-type MIS transistor formation region. For example, the first FUSI gate electrode 24a has a composition of NiSi. Thereafter, the semiconductor substrate 10 is immersed in an etchant, a mixed solution of sulfuric acid and hydrogen peroxide solution, to remove the unreacted first metal film 23 remaining on the first interlayer insulating film 21, the underlying protective film 20, the first sidewall 17a, the second sidewall 17b, and the like.

Figure 6D:
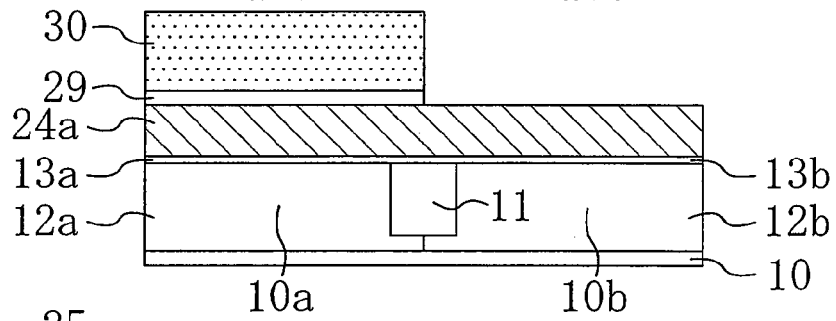

As shown in FIG. 6D, a mask insulating film 29 is then formed on the first FUSI gate electrode 24a in the n-type MIS transistor formation region and the first FUSI gate electrode 24a in the p-type MIS transistor formation region. For example, the mask insulating film 29 is a silicon oxide film. A resist mask pattern 30 is then formed so as to cover the n-type MIS transistor formation region. By using the resist mask pattern 30 as a mask, the mask insulating film 29 formed on the first FUSI gate electrode 24a in the p-type MIS transistor formation region is removed by a dry etching method to expose the top surface of the first FUSI gate electrode 24a in the p-type MIS transistor formation region.

Figure 6E:
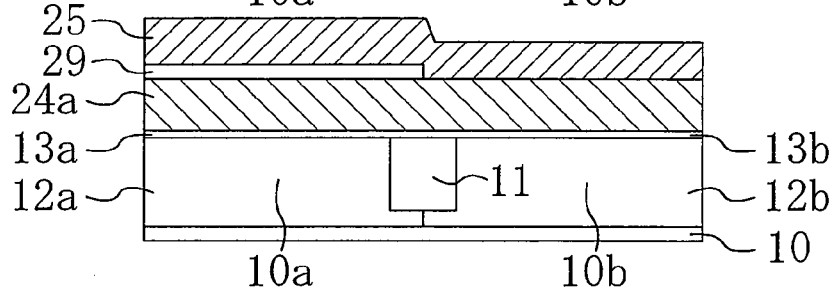

As shown in FIG. 6E, the resist mask pattern 30 is then removed, and a second metal film 25 (corresponding to a second full silicidation metal film in the second embodiment) is deposited over the whole surface of the semiconductor substrate 10 so as to cover the mask insulating film 29 in the n-type MIS transistor formation region and the first FUSI gate electrode 24a in the p-type MIS transistor formation region. For example, the second metal film 25 is made of nickel with a thickness of 70 nm.

Figure 7A:
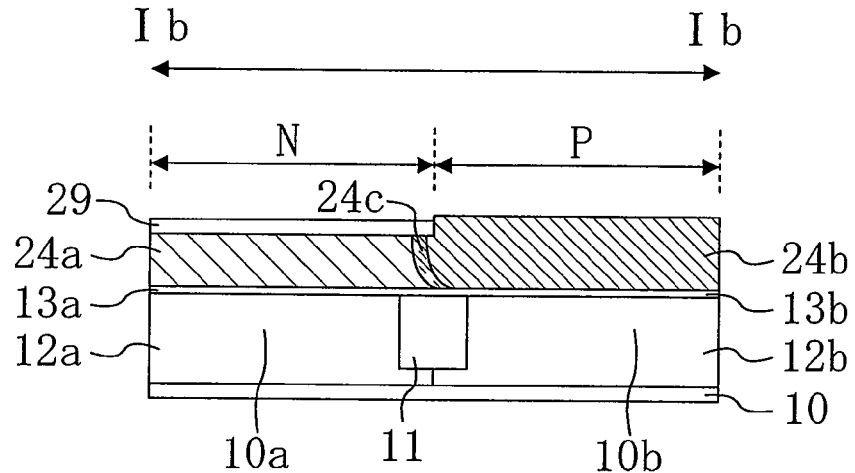
FIGS. 7A and 7B are cross-sectional views of a main part of the semiconductor device in the gate width direction and FIG. 7C show cross-sectional views of a main part of the semiconductor device in the gate length direction, sequentially illustrating the steps of the manufacturing method of the semiconductor device according to the second embodiment of the invention.

As shown in FIG. 7A, the semiconductor substrate 10 is then subjected to an RTA process at 380° C. in a nitrogen atmosphere to cause a reaction between the first FUSI gate electrode 24a in the p-type MIS transistor formation region and nickel of the second metal film 25. As a result, a second FUSI gate electrode 24b is formed. For example, the second FUSI gate electrode 24b has a composition of $Ni_2Si$. In this process, Ni-richer $Ni_{31}Si_{12}$ or $Ni_3Si$ FUSI can be formed by adjusting the nickel film thickness, and the annealing temperature and time. Note that since there is the mask insulating film 29 on the first FUSI gate electrode 24a in the n-type MIS transistor formation region, the first FUSI gate electrode 24a does not react with the second metal film 25. Therefore, the FUSI gate electrode in the n-type MIS transistor formation region still has a composition of NiSi. Thereafter, the semiconductor substrate 10 is immersed in an etchant, a mixed solution of sulfuric acid and hydrogen peroxide solution, to remove the unreacted second metal film 25 remaining on the first interlayer insulating film 21, the underlying protective film 20, the mask insulating film 29, the second sidewall 17b, and the like. An additional annealing process may be conducted at 500° C. for about 30 seconds in a nitrogen atmosphere in order to obtain a uniform silicide composition in each of the first FUSI gate electrode 24a and the second FUSI gate electrode 24b. This process can reduce the possibility that the gate electrode has an uneven silicide composition in the vertical direction. For example, this process can reduce the possibility that the first FUSI gate electrode 24a in the n-type MIS transistor formation region has a Ni-rich silicide composition in its upper portion and has silicon remaining in its lower portion near the gate insulating film. As a result, a uniform silicide composition can be obtained. A silicide composition mixed region 24c is formed at the boundary between the first FUSI gate electrode 24a in the n-type MIS transistor formation region and the second FUSI gate electrode 24b in the p-type MIS transistor formation region. However, in the step of forming the first and second FUSI gate electrodes 24a and 24b, the silicon film does not have a difference in thickness at the boundary between the first gate electrode formation portion 14a and the second gate electrode formation portion 14b (in the step of forming the second FUSI gate electrode 24b, the FUSI film of the first FUSI gate electrode 24a does not have a difference in thickness). Therefore, as in the first embodiment, expansion of the silicide composition mixed region 24c can be suppressed as compared to the conventional manufacturing method. Moreover, in the step of forming the second FUSI gate electrode 24b, since there is the mask insulating film 29 on the first FUSI gate electrode 24a in the n-type MIS transistor formation region, volume expansion is suppressed. As a result, expansion of the silicide composition mixed region 24c can be suppressed as compared to the first embodiment. Accordingly, the invention can further avoid the conventional problems caused by the silicide composition mixed region. For example, the invention does not need a larger element isolation region that hinders dimensional reduction and prevents degradation of transistor driving capability. For example, the silicide composition mixed region 24c has an intermediate composition between the NiSi FUSI composition of the first FUSI gate electrode 24a and the $Ni_2Si$, $Ni_{31}Si_{12}$, or $Ni_3Si$ FUSI composition of the second FUSI gate electrode 24b.

Figure 7B:
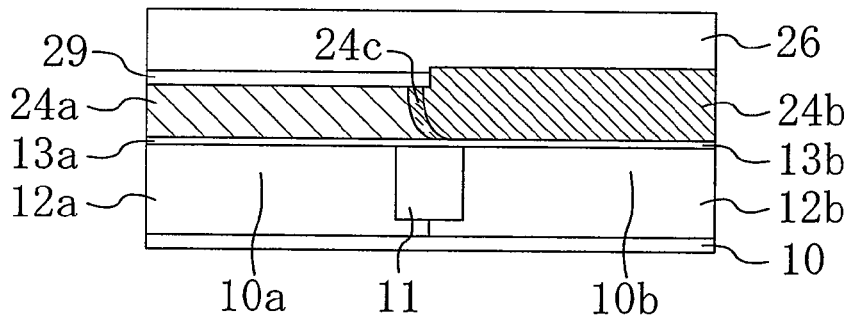
Figure 7C:
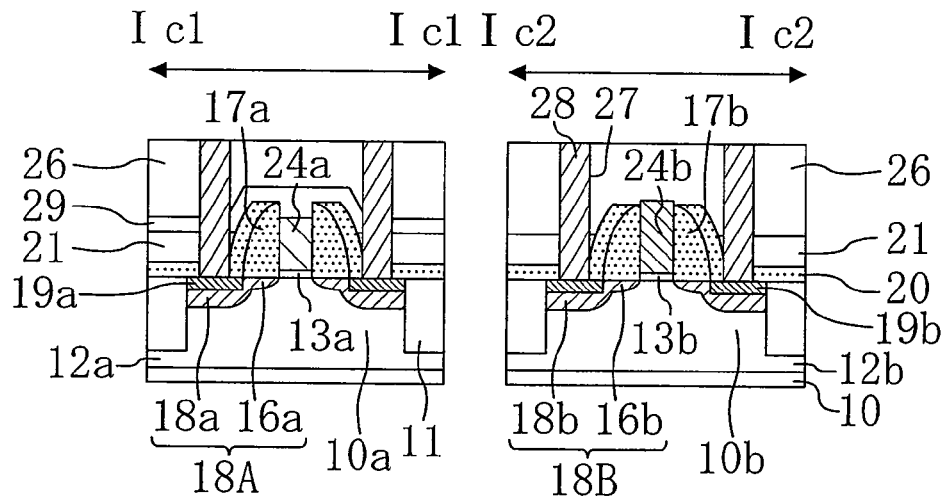

As shown in FIG. 7B, a second interlayer insulating film 26 is then formed over the whole surface of the semiconductor substrate 10 by, for example, a CVD method so as to cover the mask insulating film 29 and the second FUSI gate electrode 24b. The surface of the second interlayer insulating film 26 is then planarized by a CMP method.

Thereafter, as in a common manufacturing method of a semiconductor device having a MIS transistor, a resist mask pattern (not shown) is formed on the second interlayer insulating film 26. By using the resist mask pattern as a mask, contact holes 27 are formed in the underlying protective film 20, the first interlayer insulating film 21, the mask insulating film 29, and the second interlayer insulating film 26 by a dry etching method so as to reach the respective top surfaces of the silicide films 19a and 19b formed at the respective surfaces of the source/drain regions 18A and 18B. In this process, an overetch amount of each silicide film 19a, 19b can be reduced by using a two-step etching method in which etching is stopped once when the underlying protective film 20 made of a silicon nitride film is exposed.

A barrier metal film is then formed on the bottom and sidewall of each contact hole by a sputtering method or a CVD method. The barrier metal film is formed by sequentially depositing titanium and titanium nitride. A tungsten film is then deposited on the second interlayer insulating film 26 by a CVD method so as to fill each contact hole. The tungsten film that is present outside each contact hole is then removed by a CMP method. As shown in FIG. 7C, the tungsten film is formed in each contact hole with the barrier metal film interposed therebetween, and a contact plug 28 is thus formed in each contact hole. A metal wiring (not shown) for electrically connecting to each contact plug is then formed on the second interlayer insulating film 26. FIG. 7C shows cross-sectional views corresponding to the step of FIG. 7B and taken along line Ic1-Ic1 and line Ic2-Ic2 in FIG. 1A.

The semiconductor device of this embodiment can thus be manufactured by the manufacturing method of this embodiment. The semiconductor device of this embodiment is characterized in that, unlike the conventional example, the top surface of the first FUSI gate electrode 24a in the n-type MIS transistor formation region is located lower than the top surface of the second FUSI gate electrode 24b in the p-type MIS transistor formation region as in the first embodiment and in that, unlike the first embodiment, the mask insulating film 29 is present in the n-type MIS transistor formation region, and expansion of the silicide composition mixed region 24c is suppressed.

First Modification

Hereinafter, a semiconductor device and a manufacturing method thereof according to a first modification of the second embodiment of the invention will be described. Note that the differences between the first modification and the second embodiment will be mainly described below and description of the same parts will not be repeated.

In the second embodiment, a silicon oxide film is used as the mask insulating film 29 that is formed on each protective film 15a, 15b and the first FUSI gate electrode 24a.

On the other hand, the first modification is characterized in that a silicon nitride film is used as a mask insulating film 31 that is formed on the first FUSI gate electrode 24a and in that before the first metal film 23 is formed on the first gate electrode formation portion 14a and the second gate electrode formation portion 14b, the first interlayer insulating film 21 formed on the underlying protective film 20 is removed by an etching method and the mask insulating film 31 is formed on the underlying protective film 20.

Figure 8A:
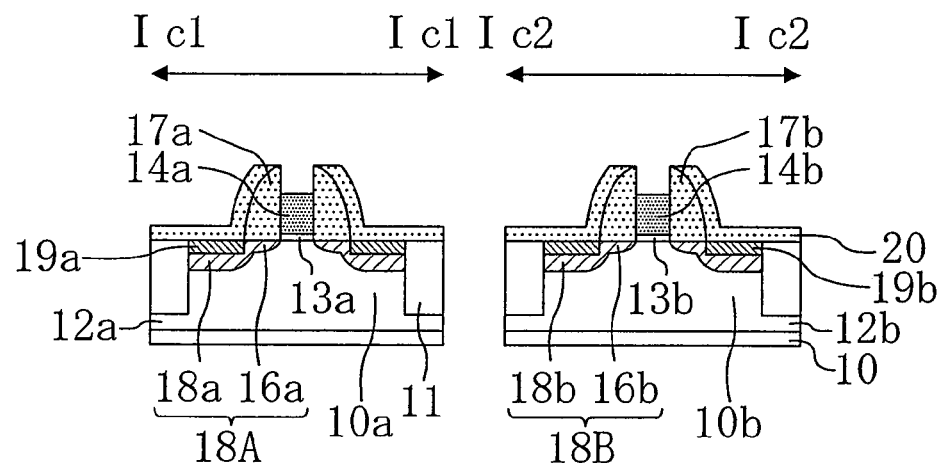
FIGS. 8A and 8B show cross-sectional views of a main part of a semiconductor device in a gate length direction, illustrating a part of the steps of a manufacturing method of a semiconductor device according to a first modification of the second embodiment of the invention.
Figure 8B:
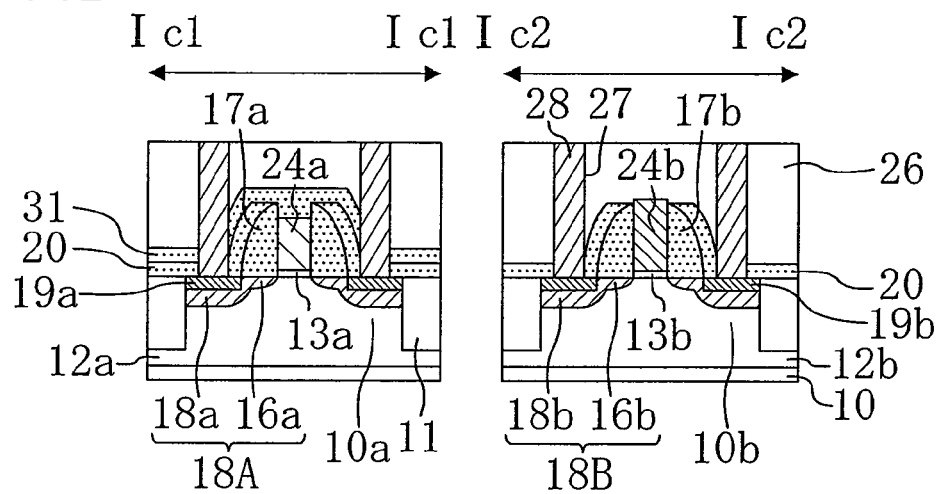

Hereinafter, the semiconductor device and the manufacturing method thereof according to this modification will be described with reference to FIGS. 8A and 8B. FIGS. 2A through 2E, FIGS. 3A through 3C, FIGS. 6B through 6E, and FIGS. 7A and 7B will also be referred as required. FIGS. 8A and 8B are cross-sectional views of a main part of a semiconductor device in a gate length direction, illustrating a part of the steps of the manufacturing method of the semiconductor device according to this modification.

First, the steps of FIGS. 2A through 2E and FIGS. 3A through 3C described above are sequentially conducted.

As shown in FIG. 8A, the first protective film 15a formed on the first gate electrode formation portion 14a and the second protective film 15b formed on the second gate electrode formation portion 14b are removed by a dry etching method or a wet etching method to expose the respective top surfaces of the first gate electrode formation portion 14a and the second gate electrode formation portion 14b. Etching conditions are determined so that the selectivity to the silicon nitride film and the polysilicon film is high. The first interlayer insulating film 21 formed on the underlying protective film 20 is also simultaneously removed in this step.

The subsequent steps are the same as those of FIGS. 6B through 6E and FIGS. 7A and 7B described above. In this modification, however, a mask insulating film 31 made of a silicon nitride film is formed instead of the mask insulating film 29 made of a silicon oxide film in the step of FIG. 6D. More specifically, the mask insulating film 31 made of a silicon nitride film is formed on the first FUSI gate electrode 24a in the n-type MIS transistor formation region and on the first FUSI gate electrode 24a in the p-type MIS transistor formation region. The steps are the same as those described above except that the mask insulating film 31 made of a silicon nitride film is formed.

The semiconductor device of this modification shown in FIG. 8B can thus be manufactured by the manufacturing method of this modification. The semiconductor device has the same structural characteristics as those obtained when the mask insulating film 29 made of a silicon oxide film is used. In other words, the semiconductor device of this modification is characterized in that, unlike the conventional example, the top surface of the first FUSI gate electrode 24a in the n-type MIS transistor formation region is located lower than the top surface of the second FUSI gate electrode 24b in the p-type MIS transistor formation region as in the first embodiment and in that, unlike the first embodiment, the mask insulating film 31 is present in the n-type MIS transistor formation region, and expansion of the silicide composition mixed region 24c is suppressed. In addition, in the semiconductor device of this modification, the mask insulating film 31 made of a silicon nitride film is in contact with the underlying protective film 20. Therefore, the underlying protective film 20 and the mask insulating film 31 have internal tensile stress, and tensile stress is applied in the channel length direction in the channel region. As a result, carrier mobility in the n-type MIS transistor is improved and a current is increased, resulting in improved transistor driving capability. For example, a plasma CVD method may be used to cause the silicon nitride film forming the mask insulating film 31 to have internal tensile stress.

Second Modification

Hereinafter, a semiconductor device and a manufacturing method thereof according to a second modification of the second embodiment of the invention will be described. The differences between the first and second modifications will be mainly described below and description of the same parts as those of the first modification will not be repeated.

In the first modification, after the step of FIG. 8A, the first metal film 23 such as nickel is deposited with a thickness of, for example, 40 nm over the whole surface of the semiconductor substrate 10 by, for example, a sputtering method so as to cover the second gate electrode formation portion 14a in the n-type MIS transistor formation region and the second gate electrode formation portion 14b in the p-type MIS transistor formation region. Thereafter, an RTA process is conducted to cause a reaction between silicon of the first gate electrode formation portion 14a in the n-type MIS transistor formation region and nickel of the first metal film 23 and between silicon of the second gate electrode formation portion 14b in the p-type MIS transistor formation region and nickel of the first metal film 23. The first gate electrode formation portion 14a and the second gate electrode formation portion 14b are thus fully silicided to form a first FUSI gate electrode 24a having a composition of, for example, NiSi (see FIG. 6C).

Figure 9:
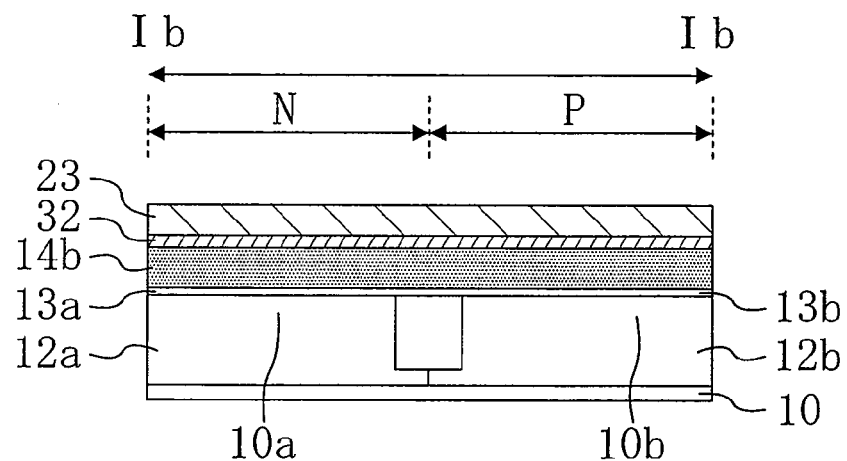
FIG. 9 is a cross-sectional view of a main part of a semiconductor device in a gate width direction, illustrating a part of the steps of a manufacturing method of a semiconductor device according to a second modification of the second embodiment of the invention.
Figure 10A:
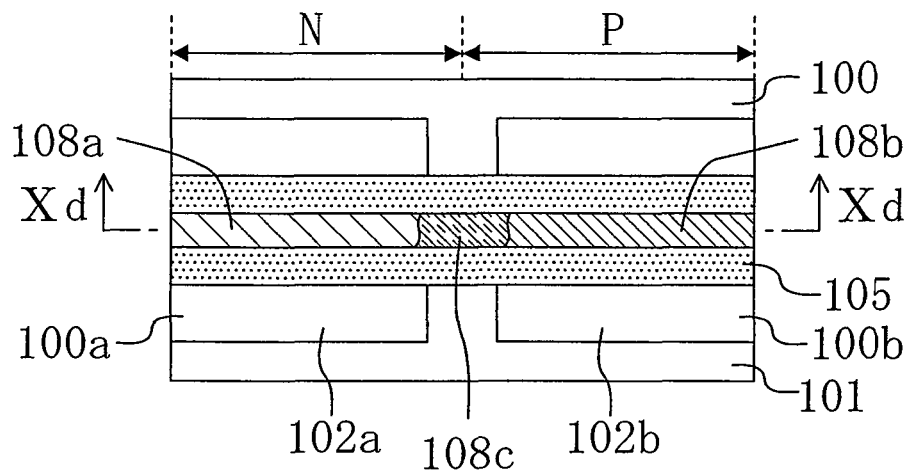
FIG. 10A is a plan view of the structure of a conventional semiconductor device.
Figure 10B:
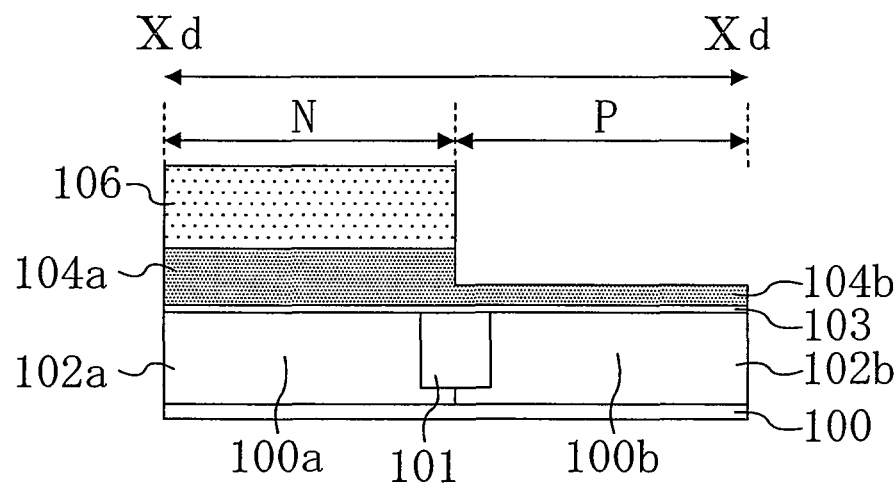
FIGS. 10B, 10C, and 10D are cross-sectional views of a main part of the semiconductor device in a gate width direction, sequentially illustrating the steps of a conventional manufacturing method of a semiconductor device.
Figure 10C:
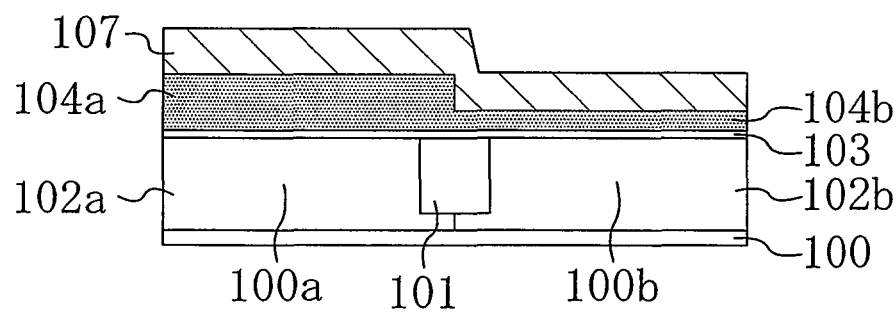
Figure 10D:
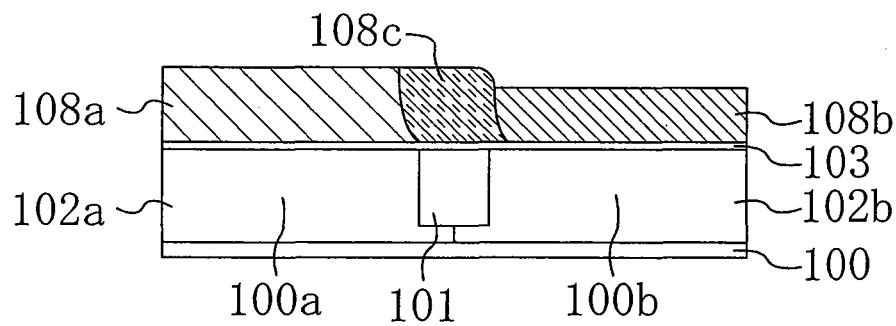

On the other hand, this modification is characterized in that, as shown in FIG. 9 (corresponding to the step of FIG. 6B described above), an RTA process is conducted after a first metal film 23 is deposited with a thickness of 40 nm over the whole surface of the semiconductor substrate 10 by, for example, a sputtering method so as to cover the second gate electrode formation portion 14a in the n-type MIS transistor formation region and the second gate electrode formation portion 14b in the p-type MIS transistor formation region. The first metal film 23 is a nickel film having a titanium (Ti) layer with a thickness of several nanometers inserted as its lowermost layer. FIG. 9 is a cross-sectional view of a main part of the semiconductor device in the gate width direction, illustrating a part of the steps of the manufacturing method of the second modification of the second embodiment.

In this way, the first gate electrode formation portion 14a and the second gate electrode formation portion 14b are fully silicided by causing silicon of the first gate electrode formation portion 14a in the n-type MIS transistor formation region and silicon of the second gate electrode formation portion 14b in the p-type MIS transistor formation region to react with nickel of the first metal film 23 having the Ti layer 32 inserted as its lowermost layer. The first FUSI gate electrode 24a having a silicon-rich composition of $NiSi_2$ can thus be formed at a lower temperature (450° C. or less) as compared to the conventional manufacturing method (about 750° C.). Since $NiSi_2$ has a lower work function than that of NiSi, a threshold voltage of the n-type MIS transistor can be reduced. Note that the composition of the first FUSI gate electrode 24a may slightly contain Ti, but this does not affect the silicon-rich composition of $NiSi_2$.

This method is effective to arbitrarily determine combination of an n-type MIS transistor and a p-type MIS transistor, which was difficult in the conventional manufacturing method. For example, for applications using a transistor of a relatively low threshold voltage, a FUSI gate electrode having a composition of $NiSi_2$ can be used as an n-type MIS transistor and a FUSI gate electrode having a composition of $Ni_3Si$ ($Ni_{31}Si_{12}$) can be used as a p-type MIS transistor. For applications using a transistor of a relatively high threshold voltage, a FUSI gate electrode having a composition of NiSi can be used as an n-type MIS transistor and a FUSI gate electrode having a composition of $Ni_2Si$ can be used as a p-type MIS transistor.

Note that this modification is applicable not only to the first modification but is similarly applicable to the first and second embodiments.

In the first embodiment, the second embodiment, and the modifications thereof, a high dielectric film is used as a gate insulating film formation film. For example, the high dielectric film may be a high dielectric film made of a hafnium-based oxide such as hafnium oxide ($HfO_2$), hafnium silicate (HfSiO), and hafnium silicate nitride (HfSiON).

Another example of the high dielectric film is a high dielectric film containing at least one element of transition elements such as zirconium (Zr), titanium (Ti), tantalum (Ta), scandium (Sc), and yttrium (Y), aluminum (Al), and rare earth elements such as lanthanoids including lanthanum (La).

In the first embodiment, the second embodiment, and the modifications thereof, a polysilicon film is used to form the gate electrode formation film 14. However, an amorphous silicon film or other semiconductor materials containing silicon may alternatively be used.

In the first embodiment, the second embodiment, and the modifications thereof, a metal film made of nickel is used as a metal film that is caused to react with the upper portion of each source/drain region 18A, 18B in the step of forming the silicide films 19a and 19b. However, a metal film containing at least one metal of a silicidation metal group consisting of cobalt, titanium, tungsten, and the like may alternatively be used.

In the first embodiment, the second embodiment, and the modifications thereof, a metal film made of nickel is used as the metal films 23 and 25 that are caused to react with the entire gate electrode formation films 14a and 14b in the step of forming the FUSI gate electrodes. However, a metal film containing at least one metal of a full silicidation metal group consisting of transition metals such as cobalt (Co), platinum (Pt), titanium (Ti), ruthenium (Ru), and iridium (Ir), and lanthanoids such as ytterbium (Yb) may alternatively be used.

In the first embodiment, the second embodiment, and the modifications thereof, the sidewalls 17a, 17b are made of a silicon nitride film. Alternatively, at least one of an insulating film (e.g., a silicon oxide film) having an I-shaped cross section and an insulating film (e.g., a silicon oxide film) having an L-shaped cross section may be inserted on each side surface of the first and second FUSI gate electrodes 24a and 24b.

The invention can accurately implement a FUSI gate electrode made of a metal silicide film having a desired silicide composition ratio. Therefore, the invention is useful for a semiconductor device having a fully silicided gate electrode and a manufacturing method of such a semiconductor device.

What is claimed is:

1. A semiconductor device, comprising:
   an n-type MIS (Metal Insulator Semiconductor) transistor formed over a first active region of a semiconductor substrate;
   a p-type MIS transistor formed over a second active region of the semiconductor substrate; and
   an interlayer insulating film formed over the semiconductor substrate so as to cover the n-type MIS transistor and the p-type MIS transistor, wherein
   the n-type MIS transistor includes a first gate insulating film formed on the first active region, a first fully silicided (FUSI) gate electrode formed on the first gate insulating film and made of a first metal silicide film, and a first sidewall insulating film formed on a side surface of the first FUSI gate electrode,
   the p-type MIS transistor includes a second gate insulating film formed on the second active region, a second fully silicided (FUSI) gate electrode formed on the second gate insulating film and made of a second metal silicide film, and a second sidewall insulating film formed on a side surface of the second FUSI gate electrode,
   a top surface of the first FUSI gate electrode is located lower than a top surface of the second FUSI gate electrode, and
   the first FUSI gate electrode and the second FUSI gate electrode are formed integrally.

2. The semiconductor device according to claim 1, wherein the n-type MIS transistor further includes a mask insulating film formed between the first FUSI gate electrode and the interlayer insulating film so as to cover the first FUSI gate electrode.

3. The semiconductor device according to claim 2, wherein the mask insulating film is made of a silicon oxide film.

4. The semiconductor device according to claim 2, wherein the mask insulating film is made of a silicon nitride film.

5. The semiconductor device according to claim 1, wherein
   the n-type MIS transistor further includes a first extension region formed in a region outside the first FUSI gate electrode in the first active region, and a first source/drain region formed in a region outside the first sidewall insulating film in the first active region, and
   the p-type MIS transistor further includes a second extension region formed in a region outside the second FUSI gate electrode in the second active region, and a second source/drain region formed in a region outside the second sidewall insulating film in the second active region.

6. The semiconductor device according to claim 5, wherein the n-type MIS transistor further includes a first silicide film formed on the first source/drain region, and the p-type MIS transistor further includes a second silicide film formed on the second source/drain region.

7. The semiconductor device according to claim 1, wherein the first metal silicide film is made of NiSi or $NiSi_2$, and the second metal silicide film is made of $Ni_{31}Si_{12}$, $Ni_3Si$, or $Ni_2Si$.

8. The semiconductor device according to claim 1, wherein the first gate insulating film and the second gate insulating film include a high dielectric film having a dielectric constant of at least 10.

9. The semiconductor device according to claim 1, wherein the first gate insulating film and the second gate insulating film contain a metal oxide.

10. The semiconductor device according to claim 1, wherein the first gate insulating film and the second gate insulating film contain at least one oxide of the oxide group consisting of an oxide containing hafnium, an oxide containing tantalum, an oxide containing lanthanum, and an oxide containing aluminum.

11. The semiconductor device according to claim 1, wherein the first gate insulating film and the second gate insulating film are made of at least one kind selected from rare earth metals such as hafnium oxide ($HfO_2$), hafnium silicate (HfSiO), hafnium silicate nitride (HfSiON), zirconium (Zr), titanium (Ti), tantalum (Ta), aluminum (Al), scandium (Sc), yttrium (Y), lanthanum (La), and other lanthanoids.

* * * * *